(12) United States Patent
Lee et al.

(10) Patent No.: US 11,793,092 B2
(45) Date of Patent: Oct. 17, 2023

(54) MEMORY STACKS AND METHODS OF FORMING THE SAME

(71) Applicant: Taiwan Semiconductor Manufacturing Company, Ltd., Hsinchu (TW)

(72) Inventors: Tung-Ying Lee, Hsinchu (TW); Shao-Ming Yu, Hsinchu County (TW); Yu-Chao Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/849,714

(22) Filed: Jun. 27, 2022

(65) Prior Publication Data
US 2022/0328760 A1    Oct. 13, 2022

Related U.S. Application Data

(62) Division of application No. 16/746,921, filed on Jan. 19, 2020, now Pat. No. 11,404,635.

(60) Provisional application No. 62/893,797, filed on Aug. 29, 2019.

(51) Int. Cl.
| | | |
|---|---|---|
| *H01L 45/00* | (2006.01) | |
| *H01L 27/24* | (2006.01) | |
| *H10N 70/20* | (2023.01) | |
| *H10B 63/00* | (2023.01) | |
| *H10N 70/00* | (2023.01) | |

(52) U.S. Cl.
CPC .......... *H10N 70/231* (2023.02); *H10B 63/30* (2023.02); *H10N 70/063* (2023.02); *H10N 70/841* (2023.02)

(58) Field of Classification Search
CPC .................................... H10N 70/841
See application file for complete search history.

(56) References Cited

U.S. PATENT DOCUMENTS

| | | | | |
|---|---|---|---|---|
| 2006/0228853 A1* | 10/2006 | Jeong | ............... | H10N 70/231 |
| | | | | 257/E27.005 |
| 2007/0108430 A1* | 5/2007 | Lung | ............... | H10N 70/884 |
| | | | | 257/E29.17 |
| 2009/0101883 A1* | 4/2009 | Lai | ............... | H10N 70/8616 |
| | | | | 257/3 |
| 2011/0266511 A1* | 11/2011 | Shen | ............... | H10N 70/8413 |
| | | | | 257/3 |
| 2012/0069645 A1* | 3/2012 | Goux | ............... | H10N 70/8828 |
| | | | | 365/163 |
| 2015/0200353 A1* | 7/2015 | Zhang | ............... | H10N 50/80 |
| | | | | 257/421 |
| 2019/0189691 A1* | 6/2019 | Lee | ............... | H10N 70/231 |
| 2020/0287133 A1* | 9/2020 | Sarkar | ............... | H10N 70/231 |

\* cited by examiner

*Primary Examiner* — Mounir S Amer
(74) *Attorney, Agent, or Firm* — JCIPRNET

(57) ABSTRACT

Memory stacks and method of forming the same are provided. A memory stack includes a bottom electrode layer, a top electrode layer and a phase change layer between the bottom electrode layer and the top electrode layer. A width of the top electrode layer is greater than a width of the phase change layer. A first portion of the top electrode layer uncovered by the phase change layer is rougher than a second portion of the top electrode layer covered by the phase change layer.

20 Claims, 20 Drawing Sheets

MEMORY STACKS AND METHODS OF FORMING THE SAME

CROSS-REFERENCE TO RELATED APPLICATION

This application is a divisional application of and claims the priority benefit of a prior application Ser. No. 16/746,921, filed on Jan. 19, 2020. The prior application Ser. No. 16/746,921 claims the priority benefit of U.S. provisional application Ser. No. 62/893,797, filed on Aug. 29, 2019. The entirety of the above-mentioned patent application is hereby incorporated by reference herein and made a part of this specification.

BACKGROUND

Semiconductor memories are used in integrated circuits for electronic applications, including radios, televisions, cell phones, and personal computing devices, as examples. PCRAM has several operating and engineering advantages, including high speed, low power, non-volatility, high density, and low cost. For example, PCRAM devices are non-volatile and may be written into rapidly, for example, within less than about 50 nanoseconds. The PCRAM cells may have a high density. In addition, PCRAM memory cells are compatible with CMOS logic and can generally be produced at a low cost compared to other types of memory cells. However, there are still many challenges related to PCRAMs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1:
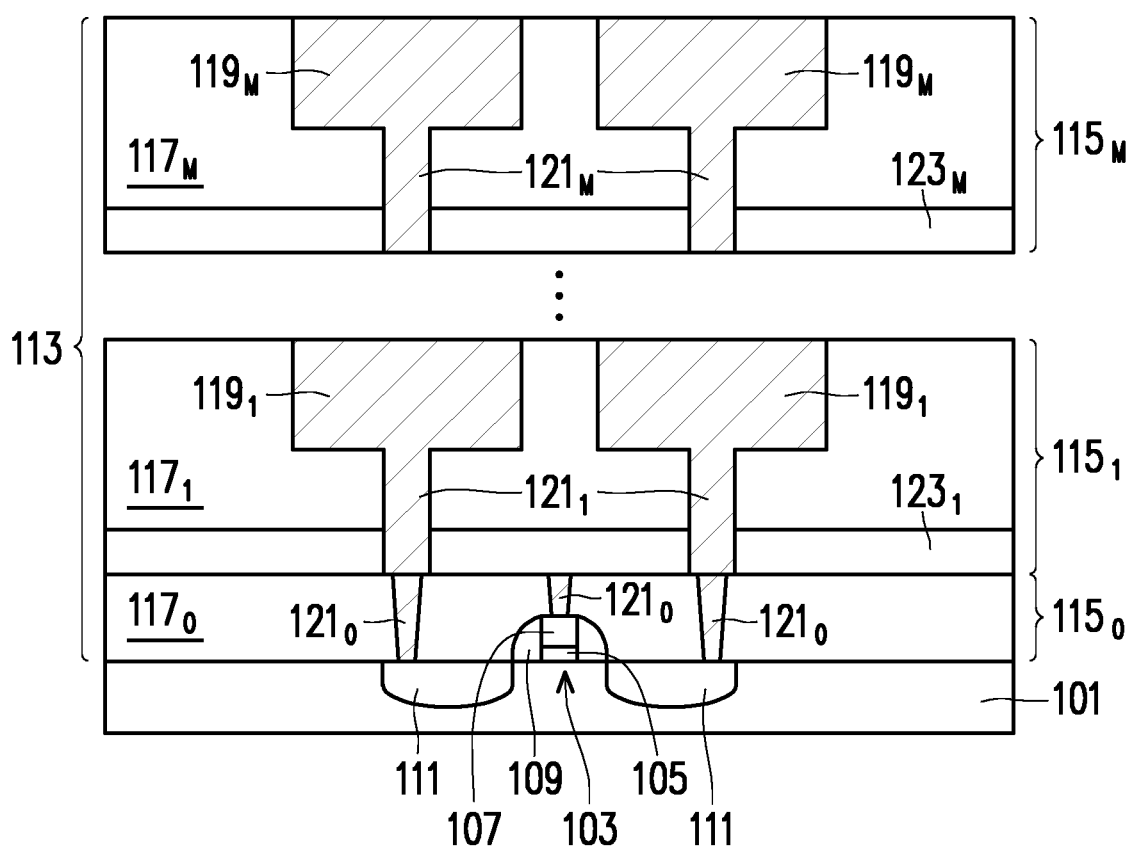
FIG. 1 to FIG. 10 illustrate cross-sectional views of intermediate stages in the manufacturing of a memory device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, a memory device, such a phase-change random access memory (PCRAM) device, and a method of forming the same. The size of a phase change layer between a bottom electrode layer and a top electrode layer is reduced without using a photolithography mask or reticle, which allows for process cost reduction. By reducing the width of the phase change layer, the heating of the phase change layer is centralized and therefore the reset current is reduced.

FIG. 1 to FIG. 10 illustrate cross-sectional views of intermediate stages in the manufacturing of a memory device in accordance with some embodiments.

In some embodiments, a substrate 101 is provided. The substrate 101 may include, bulk silicon, doped or undoped, or an active layer of a semiconductor-on-insulator (SOI) substrate. Generally, an SOI substrate includes a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate 101 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or a combination thereof. Other substrates, such as multi-layered or gradient substrates, may also be used.

In some embodiments, an access transistor 103 is formed over the substrate 101. The access transistor 103 includes a gate stack containing a gate dielectric layer 105 and a gate electrode 107, spacers 109 on opposite sidewalls of the gate stack, and source/drain regions 111 adjacent to the respective spacers 109. For simplicity, components that are commonly formed in integrated circuits, such as a gate silicide, source/drain silicides, a contact etch stop layer, and the like, are not illustrated. In some embodiments, the access transistor 103 may be formed using any suitable method. In some embodiments, the access transistor 103 may be a planar MOSFET device, a FinFET device, a tunnel FET ("TFET") device, a gate-all-around ("GAA") device or a suitable device depending on PCRAM circuitry design.

In some embodiments, additional active and/or passive devices may be formed on the substrate 101. The one or more active and/or passive devices may include transistors, capacitors, resistors, diodes, photo-diodes, fuses, or the like. The one or more active and/or passive devices may be formed using any suitable method. One of ordinary skill in the art will appreciate that the above examples are provided for the purpose of illustration only and are not meant to limit the present disclosure in any manner. Other circuitry may be also used as appropriate for a given application.

In some embodiments, an interconnect structure 113 is formed over the access transistor 103 and the substrate 101. The interconnect structure 113 may include one or more metallization layers $115_0$ to $115_M$, wherein M+1 is the number of the one or more metallization layers $115_0$ to $115_M$. In some embodiments, the value of M may vary according to design specifications. In some embodiments, the metallization layer $115_M$ may be an intermediate metallization layer of the interconnect structure 113. In such embodiments, further metallization layers are formed over the metallization layer $115_M$. In some embodiments, M is equal to 1. In other embodiments, M is greater than 1.

In some embodiments, the one or more metallization layers $115_0$ to $115_M$ include one or more dielectric layers $117_0$ to $117_M$, respectively. The dielectric layer $117_0$ is an inter-layer dielectric (ILD) layer, and the dielectric layers $117_1$ to $117_M$ are inter-metal dielectric (IMD) layers. Each of the ILD layer and the IMD layers may include a low-k dielectric material having a dielectric constant lower than about 4.0, 3.0, 2.0 or even 1.5. In some embodiments, each of the ILD layer and IMD layers may include a material such as silicon oxide, phosphosilicate glass (PSG), borophosphosilicate glass (BPSG), fluorosilicate glass (FSG), SiOC, Spin-On-Glass, Spin-On-Polymer, a silicon carbon material, a compound thereof, a composite thereof, a combination thereof, or the like, formed by any suitable method, such as spin-on coating, chemical vapor deposition (CVD), plasma-enhanced CVD (PECVD), atomic layer deposition (ALD), a combination thereof, or the like.

In some embodiments, etch stop layers (ESLs) $123_1$ to $123_M$ are formed between adjacent ones of the dielectric layers $117_0$ to $117_M$. The material for the ESLs $123_1$ to $123_M$ is chosen such that etch rates of the ESLs $123_1$ to $123_M$ are less then etch rates of corresponding ones of the dielectric layers $117_1$ to $117_M$. In some embodiments, an etching process that etches the dielectric layers $117_1$ to $117^M$ faster than the ESLs $123_1$ to $123_M$ is a dry etching process performed using an etchant comprising a $C_xF_y$-based gas, or the like. In some embodiments, an etch rate of the ESL $123_K$ is less than an etch rate of the dielectric layer $117_K$ (with K=1, ..., M). In some embodiments, each of the ESLs $123_1$ to $123_M$ may include one or more layers of dielectric materials. Suitable dielectric materials may include oxides (such as silicon oxide, aluminum oxide, or the like), nitrides (such as SiN, or the like), oxynitrides (such as SiON, or the like), oxycarbides (such as SiOC, or the like), carbonitrides (such as SiCN, or the like), carbides (such as SiC, or the like), combinations thereof, or the like, and may be formed using spin-on coating, CVD, PECVD, ALD, a combination thereof, or the like.

In some embodiments, the metallization layer $115_0$ further includes conductive plugs $121_0$ within the dielectric layer $117_0$, and the metallization layers $115_1$ to $115_M$ further include one or more conductive interconnects, such as conductive lines $119_1$ to $119_M$ and conductive vias $121_1$ to $121_M$, within the dielectric layers $117_1$ to $117_M$, respectively. The conductive plugs $121_0$ electrically couple the source/drain regions 111 and the gate electrode 107 of the access transistor 103 to the conductive lines $119_1$ to $119_M$ and the conductive vias $121_1$ to $121_M$.

In some embodiments, the conductive plugs $121_0$, the conductive lines $119_1$ to $119_M$ and the conductive vias $121_1$ to $121^M$ may be formed using any suitable method, such as a damascene method, a dual damascene method, or the like. In some embodiments, the method for forming the conductive plugs $121_0$, the conductive lines $119_1$ to $119_M$ and the conductive vias $121_1$ to $121^M$ includes forming openings in the respective dielectric layers $117_0$ to $117_M$, depositing one or more barrier/adhesion layers (not explicitly shown) in the openings, depositing seed layers (not explicitly shown) over the one or more barrier/adhesion layers, and filling the openings with a conductive material (not explicitly shown). A chemical mechanical polishing (CMP) is then performed to remove excess materials of the one or more barrier/adhesion layers, the seed layers, and the conductive material overfilling the openings. In some embodiments, the topmost surfaces of the conductive plugs $121_0$ are substantially coplanar or level with the topmost surface of the dielectric layer $117_0$ within process variations of the CMP process. In some embodiments, the topmost surfaces of the conductive lines $119_1$ to $119_M$ are substantially coplanar or level with the topmost surfaces of the dielectric layers $117_1$ to $117^M$, respectively, within process variations of the CMP process.

In some embodiments, the one or more barrier/adhesion layers may include Ti, TiN, Ta, TaN, a combination thereof, a multilayer thereof, or the like, and may be formed using physical vapor deposition (PVD), CVD, ALD, a combination thereof, or the like. The seed layers may include copper, titanium, nickel, gold, manganese, a combination thereof, a multilayer thereof, or the like, and may be formed by ALD, CVD, PVD, sputtering, a combination thereof, or the like. The conductive material may include copper, aluminum, tungsten, a combination thereof, an alloy thereof, a multilayer thereof, or the like, and may be formed using plating, or any suitable method.

Figure 2:
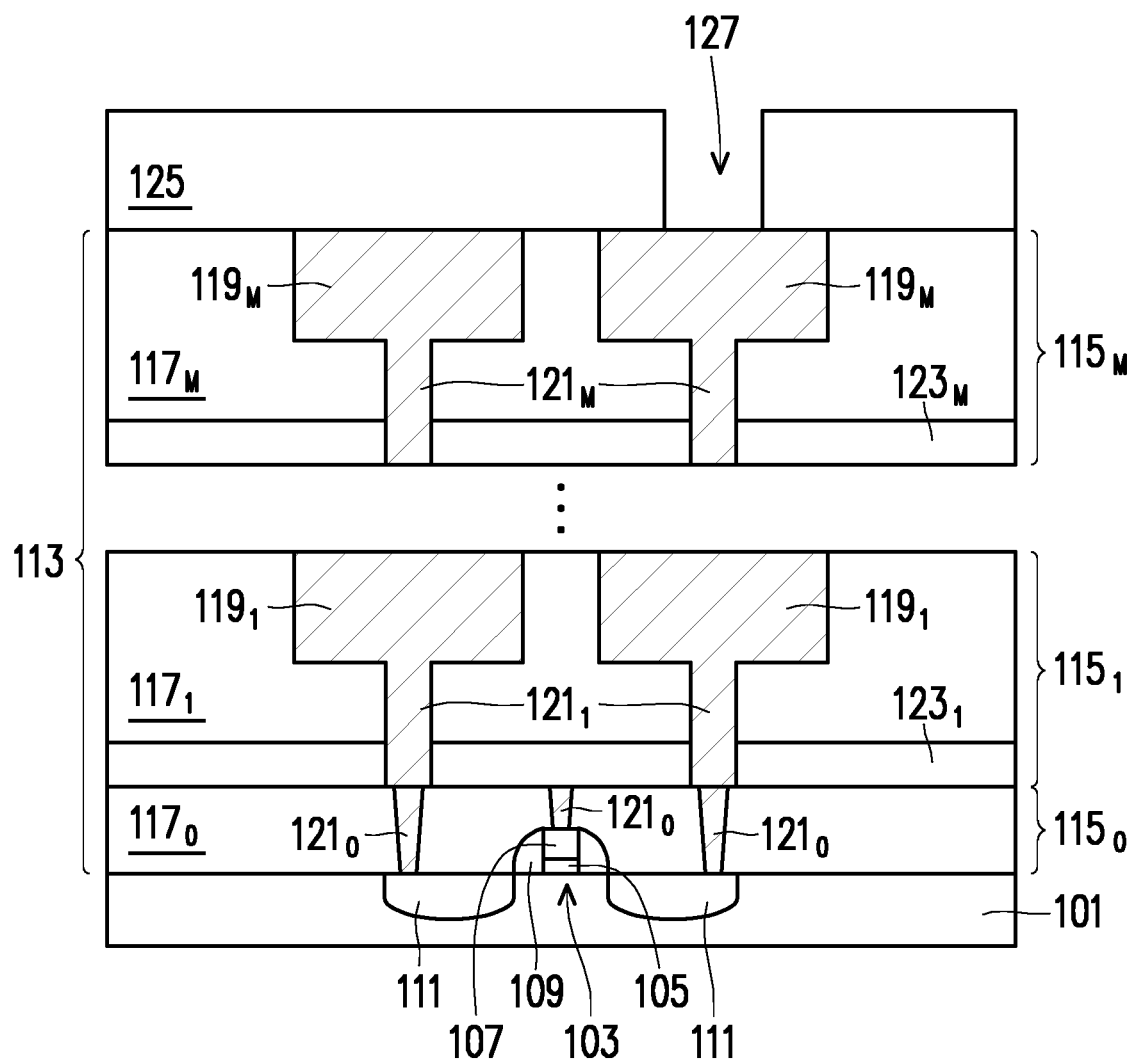

Referring to FIG. 2, a dielectric layer 125 is formed over the metallization layer $115_M$. In some embodiments, the dielectric layer 125 may be formed using the similar material and method as the dielectric layers $117_0$ to $117_M$ and the description is not repeated herein. In some embodiments, the dielectric layer 125 is patterned to form an opening 127 in the dielectric layer 125. The patterning process may include suitable photolithography and etching processes. In some embodiments, the opening 127 exposes underlying conductive line $119_M$.

Figure 3:
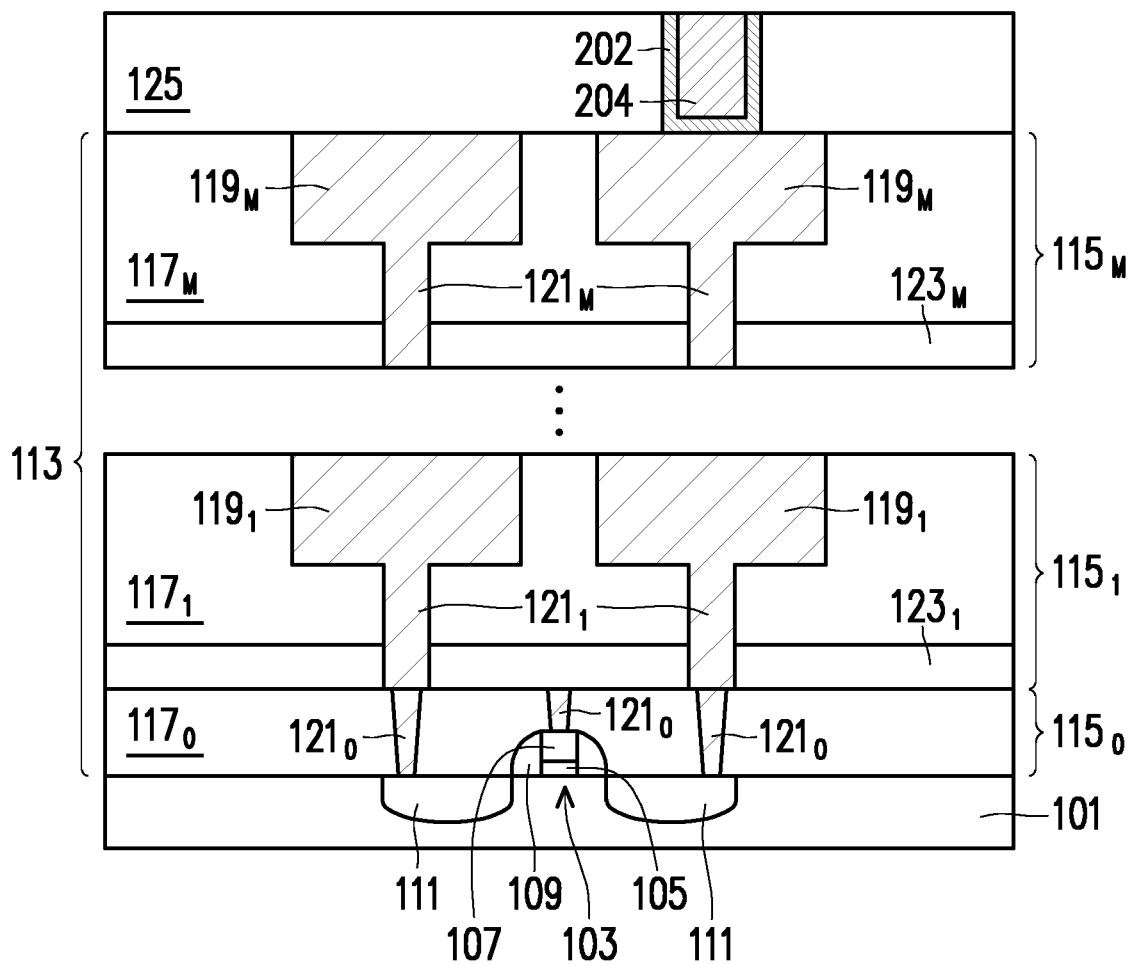

Referring to FIG. 3, a bottom electrode layer 204 is formed in the opening 127. In some embodiments, a barrier layer 202 is optionally formed between the bottom electrode layer 204 and the dielectric layer 125 and between the bottom electrode layer 204 and the conductive line $119_M$. In some embodiments, the bottom electrode layer 204 may include a conductive material such as Ti, Co, W, Ru, Cu, AlCu, WN, TiN, TiW, TiAl, TiAlN, a combination thereof, a multilayer thereof, or like, and may be formed using CVD, ALD, PVD, a combination thereof, or the like. In some embodiments, the barrier layer 202 includes a material to prevent the bottom electrode layer 204 from diffusing to the underlying layers. In some embodiments, the barrier layer 202 may include Ti, TiN, Ta, TaN, a combination thereof, a multilayer thereof, or the like, and may be formed using CVD, ALD, PVD, a combination thereof, or the like. In some embodiments, the bottom electrode layer 204 includes TiN, and the barrier layer 202 includes TaN.

In some embodiments, a barrier material layer and a bottom electrode material layer are deposited in the opening 127 and overfills the opening 127. In some embodiments, a planarization process, such as a CMP process, an etching process, a grinding process, a combination thereof, or the like, is performed on the barrier material layer and the bottom electrode material layer, so as to remove excess portions of the barrier material layer and the bottom electrode material layer overfilling the opening 127. In some embodiments, the topmost surfaces of the barrier layer 202 and the bottom electrode layer 204 are substantially coplanar or level with the topmost surface of the dielectric layer 125 within process variations of the planarization process. In some embodiments, the bottom electrode layer 204 has a width of about 15 to 40 nm.

Figure 4:
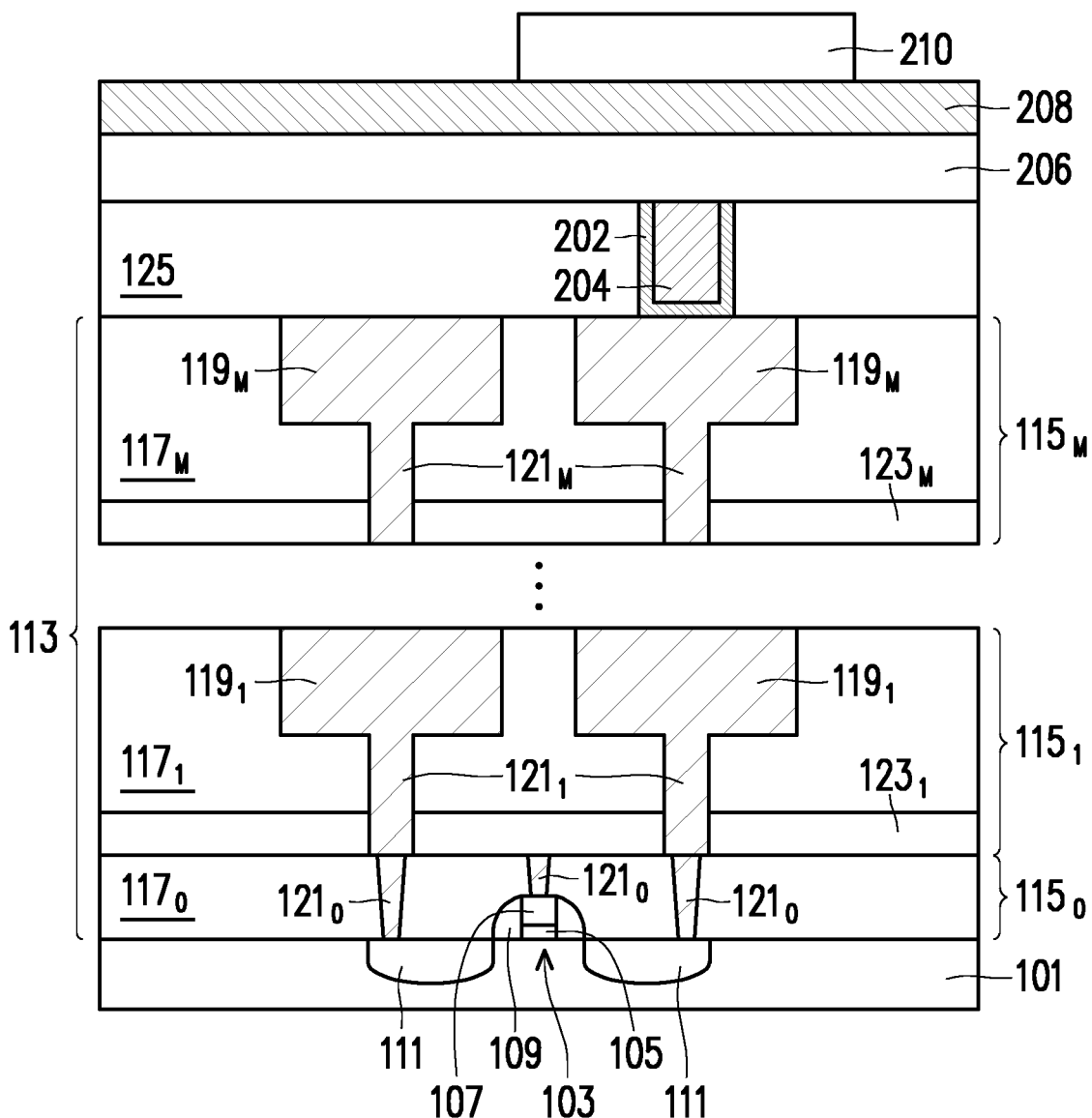

Referring to FIG. 4, a phase change material layer 206 is blanket deposited over the bottom electrode layer 204 and the dielectric layer 125. The phase change material layer 206 may include a chalcogenide material containing one or more of Ge, Te and Sb. In some embodiments, the phase change material layer 206 includes GST (e.g., $Ge_2Sb_2Te_5$), ScSbTe, GeTe, InSb, $Sb_2Te_3$, $Sb_{70}Te_{30}$, GaSb, InSbTe, GaSeTe, SnSbTe4m InSbGe, AgInSbTe, $Te_{81}Ge_{15}Sb_2S_2$, (Ge,Sn)SbTe, GeSb(SeTe) or the like. The phase change material layer 206 may be formed using ALD, CVD, PECVD, a combination thereof, or the like.

In some embodiments, a top electrode material layer 208 is blanket deposited over the phase change material layer 206. In some embodiments, the top electrode material layer 208 may include a conductive material such as Ti, Co, W, Ru, Cu, AlCu, WN, TiN, TiW, TiAl, TiAlN, a combination thereof, a multilayer thereof, or like, and may be formed using CVD, ALD, PVD, a combination thereof, or the like. In some embodiments, the bottom electrode layer 204 and the top electrode material layer 208 may include the same material. In other embodiments, the bottom electrode layer 204 and the top electrode material layer 208 may include different materials.

In some embodiments, a mask layer 210 is formed over the top electrode material layer 208. In some embodiments, the mask layer 210 may include a photoresist material and may be formed using a photolithography process. In other embodiments, the mask layer 210 may include a dielectric material such as silicon oxide, silicon nitride, silicon carbide, a combination thereof, a multilayer thereof, or the like, and may be formed using a deposition process followed by photolithography and etching processes.

Figure 5:
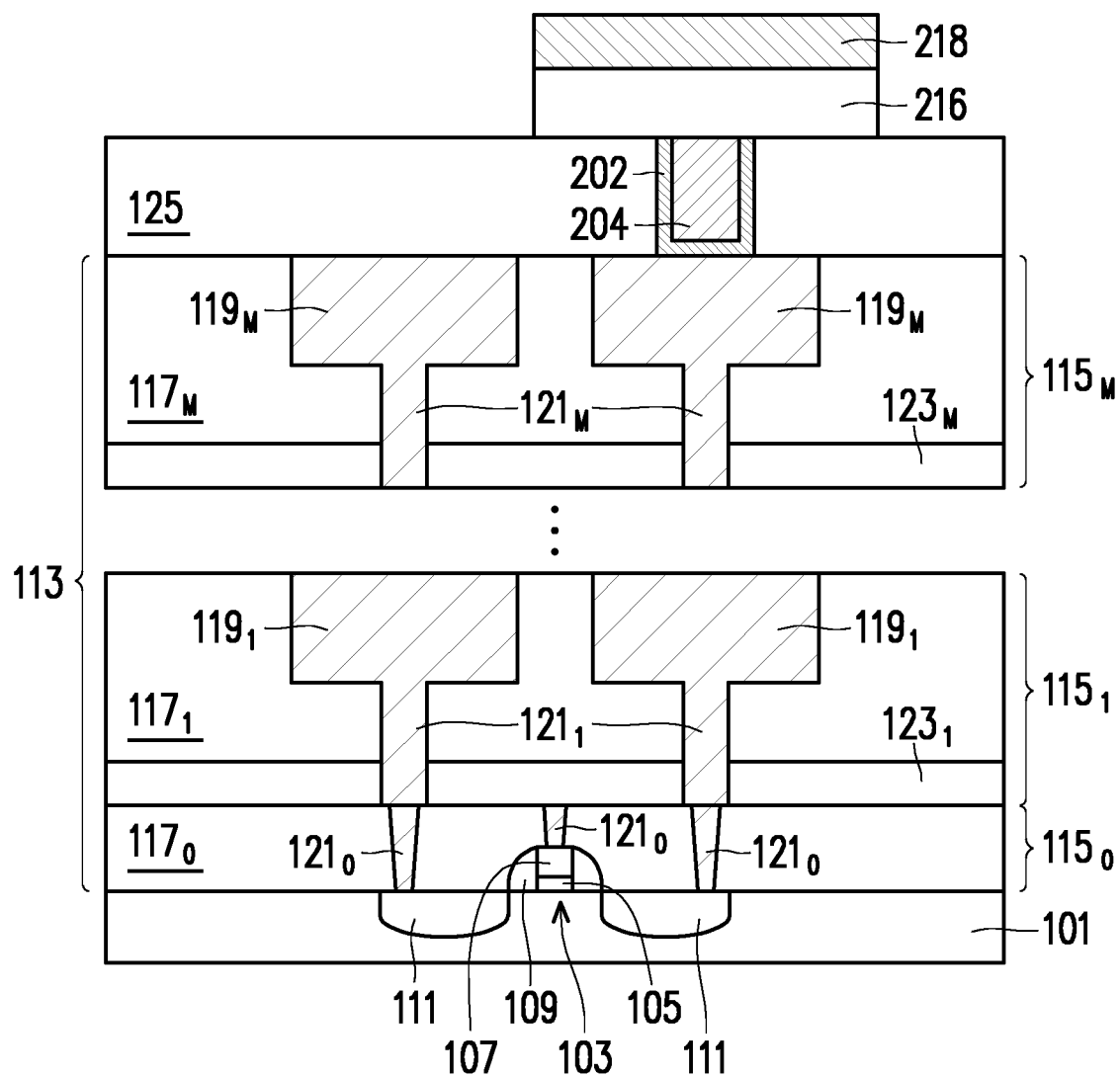

Referring to FIG. 5, the phase change material layer 206 and the top electrode material layer 208 are patterned by using the mask layer 210 as a mask, so as to form a phase change layer 216 and a top electrode layer 218 sequentially disposed on the bottom electrode layer 204. In some embodiments, the patterning process includes an anisotropic etching process, such as a dry etching process.

In some embodiments, the dry etching process includes an etching gas, a passivation gas and a heat transfer gas. In some embodiments, the etching gas includes HBr, $O_2$, $Cl_2$, $SF_6$ or a combination thereof, and has a flow rate of about 20 to 500 cubic centimeters per minute (sccm). In some embodiments, the passivation gas includes $CH_4$, $CH_3F$, $CH_2F_2$, $CHF_3$ or a combination thereof, and has a flow rate of about 10 to 100 sccm. In some embodiments, the heat transfer gas includes Ar, He or a combination thereof, and has a flow rate of about 100 to 1,000 sccm. In some embodiments, the bias voltage is turned on and set at a range from about 100 to 1,000 V during the dry etching process. In some embodiments, the dry etching process has an etching rate ratio or etching selectivity (e.g., greater than 20:1) of the phase change layer 216 with respect to the underlying dielectric layer 125.

After the phase change material layer 206 and the top electrode material layer 208 are patterned to form the phase change layer 216 and the top electrode layer 218, the mask layer 210 is then removed. In some embodiments, each of the phase change layer 216 and the top electrode layer 218 has a width of about 100 to 300 nm.

Figure 6:
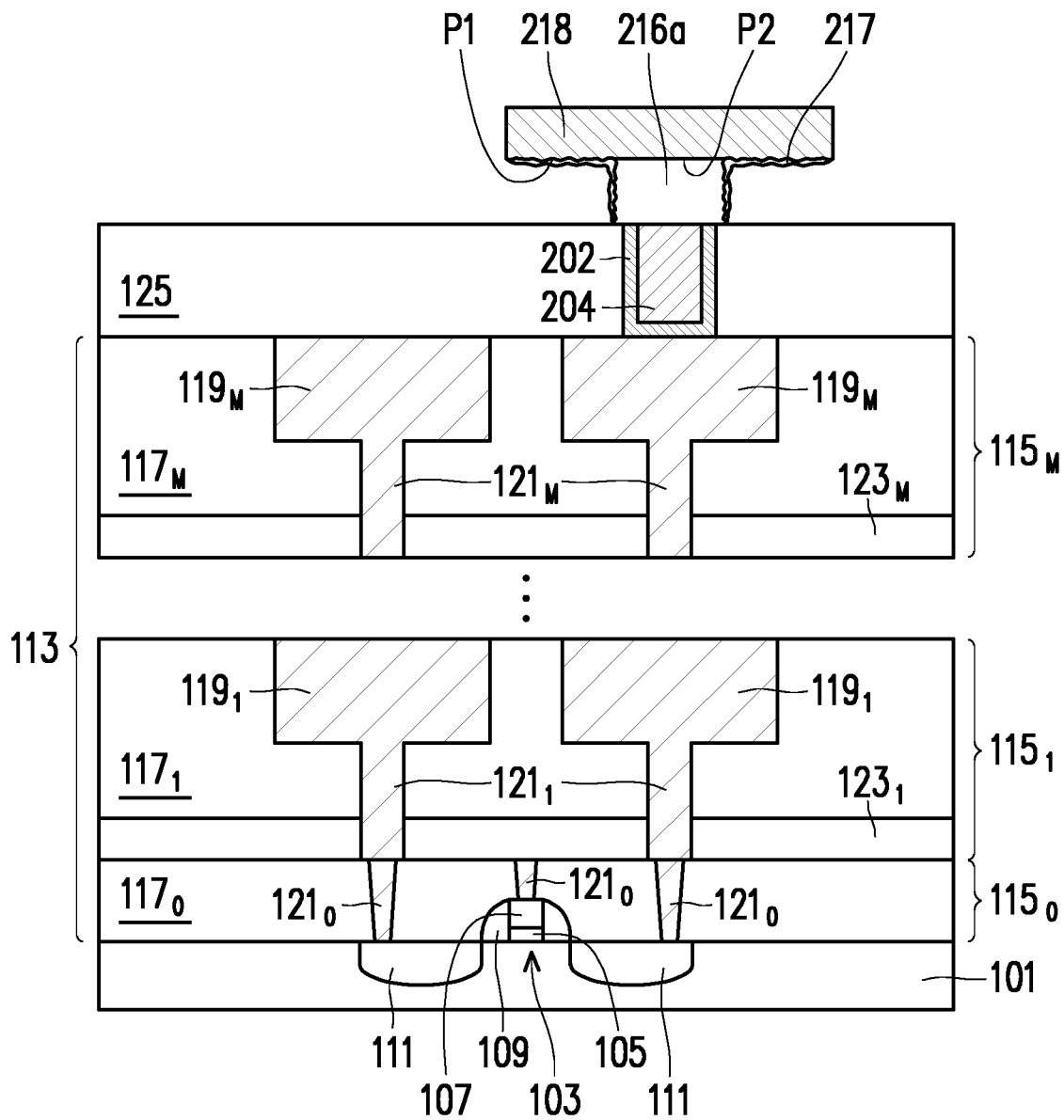

Referring to FIG. 6, a lateral etching process is performed to the phase change layer 216, so as to reduce the dimension of the phase change layer 216. In some embodiments, the lateral etching process has an etching rate ratio or etching selectivity (e.g., greater than 100:1) of the phase change layer 216 with respect to the underlying dielectric layer 125, and has an etching rate ratio or etching selectivity (greater than 30:1) of the phase change layer 216 with respect to the overlying top electrode layer 218. In some embodiments, the lateral etching process reduces the dimension of the phase change layer 216 while keeps the dimension of the top electrode layer 218 substantially unchanged. Upon the lateral etching process, the phase change layer 216 is trimmed to a phase change layer 216a with a reduced dimension. The lateral etching process is referred to as a trimming process in some example. In some embodiments, the phase change layer 216a has a width of about 20 to 100 nm.

In some embodiments, the width (e.g., bottom width) of the phase change layer 216a is greater than the width (e.g., top width) of the bottom electrode layer 204. For example, the width of the phase change layer 216a is about 1.5-3 times the width of the bottom electrode layer 204.

In some embodiments, the width (e.g., top width) of the phase change layer 316a is less than the width (e.g., bottom width) of the top electrode layer 218. For example, the width of the top electrode layer 218 is about 3-5 times the width of the phase change layer 216a.

In some embodiments, the lateral etching process includes an etching gas, a passivation gas and a heat transfer gas. In some embodiments, the etching gas includes HBr, $O_2$, $Cl_2$, $SF_6$ or a combination thereof, and has a flow rate of about 20 to 500 sccm. In some embodiments, the passivation gas includes $CH_4$, $CH_3F$, $CH_2F_2$, $CHF_3$ or a combination thereof, and has a flow rate of about 10 to 100 sccm. In some embodiments, the heat transfer gas includes Ar, He or a combination thereof, and has a flow rate of about 100 to 1,000 sccm. In some embodiments, the bias voltage is turned off during the lateral etching process.

In some embodiments, upon the lateral etching process, the first portion P1 of the top electrode layer 218 uncovered by the phase change layer 216a is rougher than the second portion P2 of the top electrode layer 218 covered by the phase change layer 216a. In some embodiments, upon the lateral etching process, the first portion P1 of the top electrode layer 218 uncovered by the phase change layer 216a has a roughness Rz of about 0.5 nm to 1.5 nm, such as about 1.0 nm, while the second portion P2 of the top electrode layer 218 covered by the phase change layer 216a has a roughness Rz of less than about 1.0 nm, such as about 0.5 nm. In some embodiments, the sidewall of the phase change layer 216a has a roughness Rz of about 0.5 nm to 1.5 nm, such as about 1.0 nm. In some embodiments, the surface roughness Rz is calculated by measuring the vertical distance from the highest peak to the lowest valley within a predetermined sampling length or area.

In some embodiments, upon the lateral etching process, a polymer layer 217 is accumulated on the sidewall of the phase change layer 216a and the bottom surface of the top electrode layer 218. The polymer layer 217 may operate to prevent the moisture from contacting the phase change layer 216a and degrading the performance of the device. In some embodiments, the polymer layer 217 has a thickness of about 5 to 20 angstroms.

In some embodiments, the polymer layer 217 includes one or more of carbon, hydrogen and oxygen atoms. In some embodiments, the polymer layer 217 includes a carbon atom content of about 30-90 at %, a hydrogen atom content of about 10-25 at %, and an oxygen atom content of less than about 5 at %.

Figure 7:
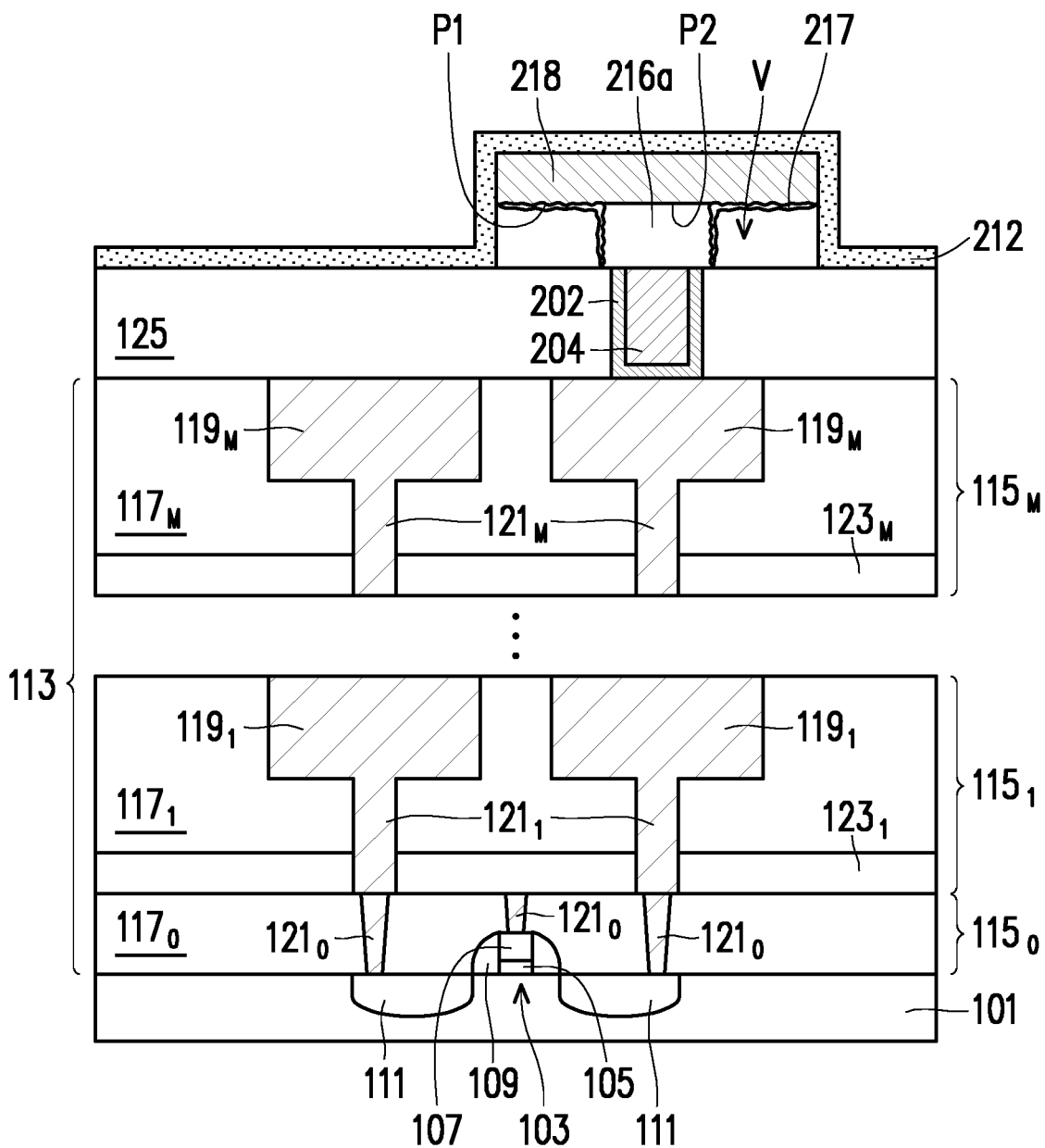

Referring to FIG. 7, a moisture-resistant material layer 212 is formed over the dielectric layer 125 and covers the top electrode layer 218. The moisture-resistant material layer 212 functions as a protection layer that effectively blocks water or moisture from penetrating into the phase change layer 216a. In some embodiments, the moisture-resistant material layer 212 is formed on the top surface of the top electrode layer 218, extends along the sidewall of the top electrode layer 218 and down to the dielectric layer 125, and continues to extend along the top surface of the dielectric layer 125. Accordingly, at least one void V is formed between the moisture-resistant material layer 212 and the phase change layer 216a and between the top electrode layer 218 and the dielectric layer 125. In some embodiments, the moisture-resistant material layer 212 may include silicon nitride ($Si_3N_4$), silicon oxynitride, silicon carbide or the like, and may be formed using an ALD process at a process temperature of less than about 400° C., such as from about 200° C. to 250° C. This process temperature is beneficial to form the moisture-resistant material layer 212 with such configuration that is able to encapsulate voids therein.

Figure 8:
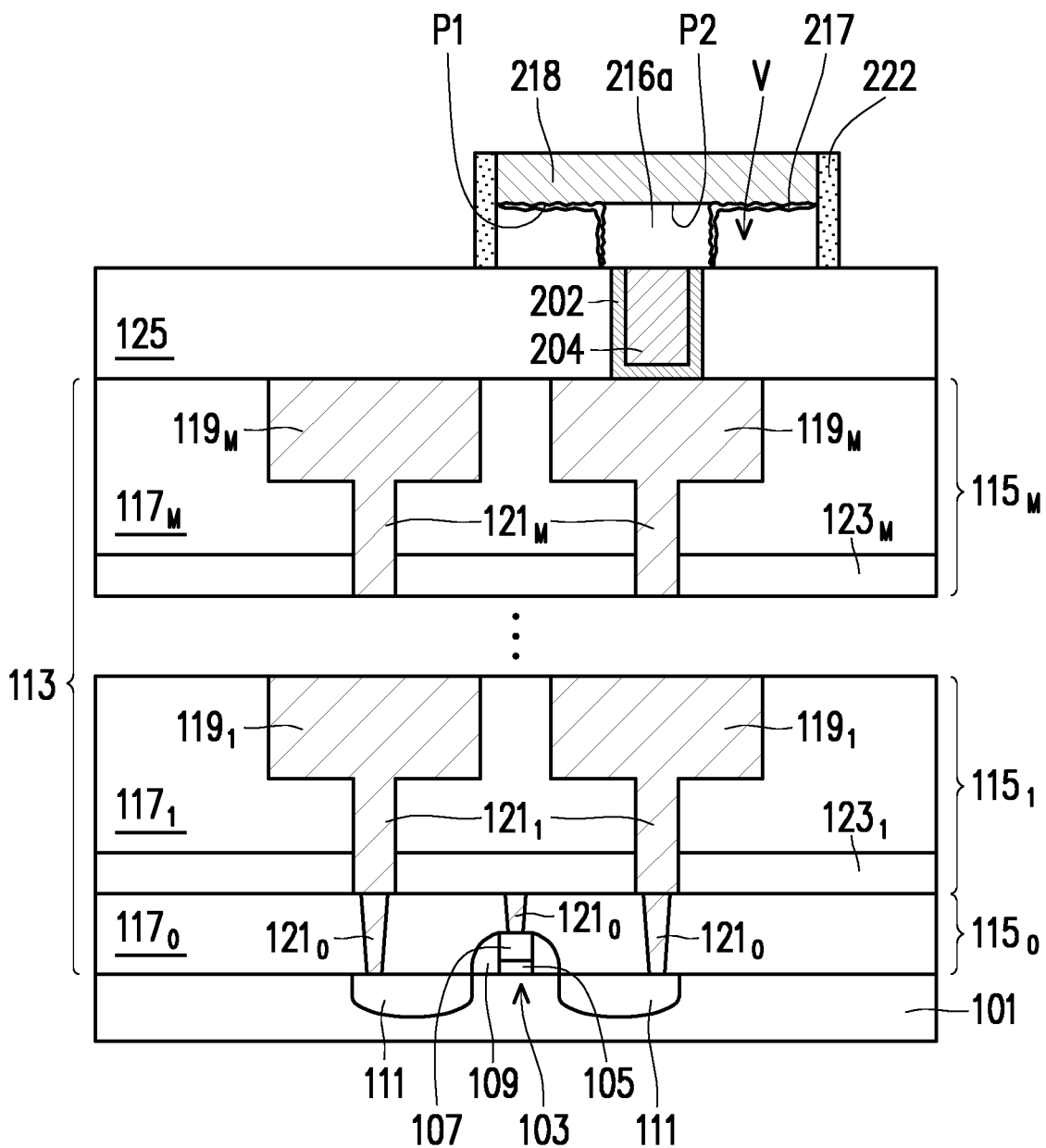

Referring to FIG. 8, an anisotropic etching process is performed to the moisture-resistant material layer 212, so as to remove a portion of the moisture-resistant material layer 212. Specifically, the lateral portion of the moisture-resistant material layer 212 is removed, while the vertical portion of moisture-resistant material layer 212 remains. In some embodiments, the remaining moisture-resistant material layer 212 forms a moisture-resistant layer 222 in a spacer form. In some embodiments, the moisture-resistant layer 222 is formed on the sidewall of the top electrode layer 218 and extends downwardly to the dielectric layer 125. Accordingly, two voids V are formed below the top electrode layer 218 and at two sides of the phase change layer 216a. In some embodiments, the voids V are filled with a gas, such as air, a process gas or an inert gas. In other embodiments, the voids V are in a vacuum state. Each of the voids V (either filled with a gas or in a vacuum state) functions as a heat insulator that is beneficial to reduce the heat loss of the phase change layer 216a due to heat conduction or convection.

Figure 9:
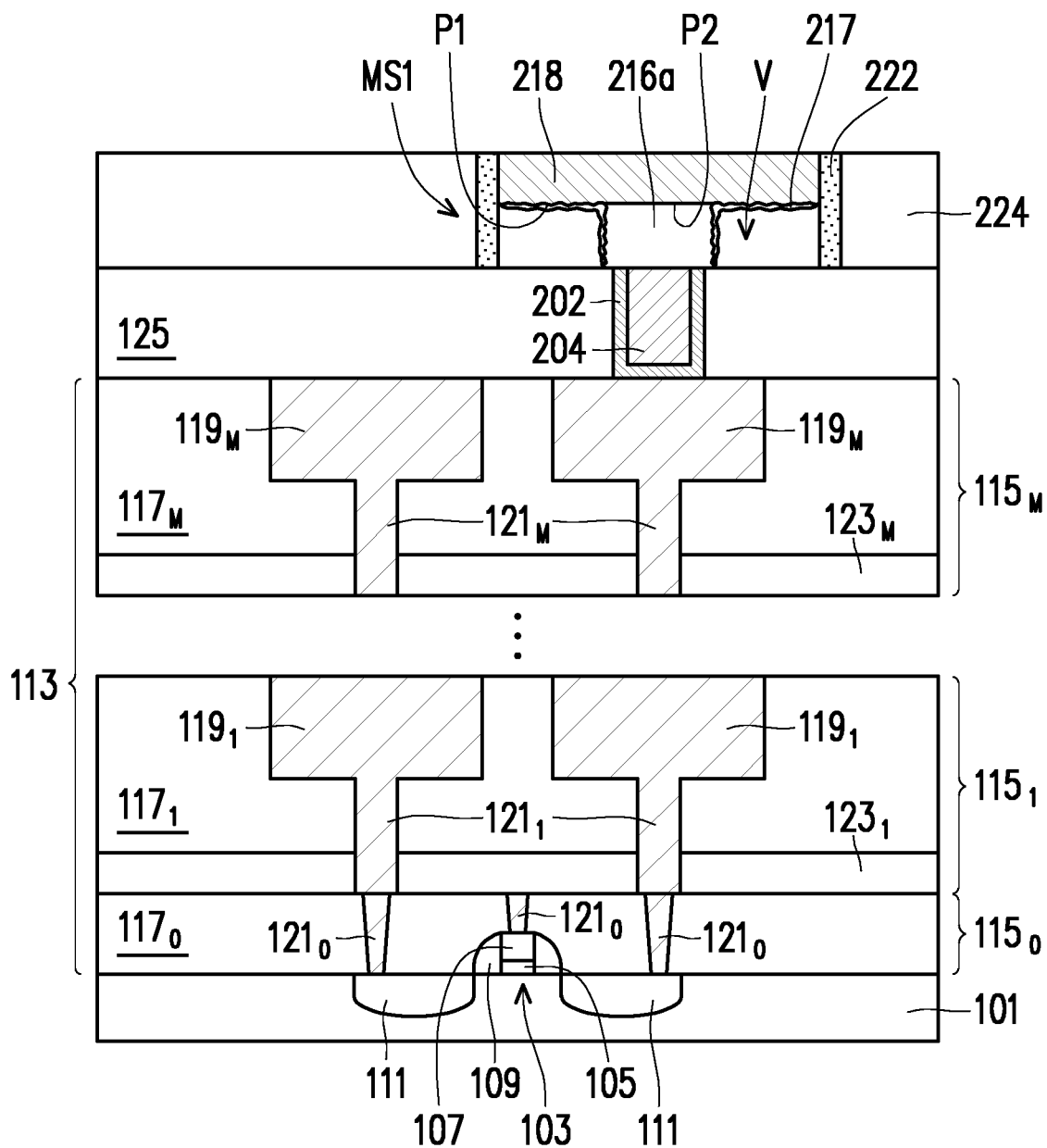

Referring to FIG. 9, a dielectric layer 224 is formed over the dielectric layer 125 and aside the moisture-resistant layer 222. In some embodiments, the dielectric layer 224 may be formed using the similar material and method as the dielectric layers $117_0$ to $117_M$. The dielectric layer 224 may include a low-k dielectric material having a dielectric constant lower than about 4.0, 3.0, 2.0 or even 1.5. In some embodiments, the dielectric layer 224 may include a material such as silicon oxide, phosphosilicate glass (PSG), borophosphosilicate glass (BPSG), HDP (high density plasma) oxide, TEOS (tetraethylorthosilicate), SiOC, SiC, a combination thereof, a multilayer thereof, or the like. In some embodiments, the dielectric layer 224 may prevent the moisture from contacting the phase change layer 216a and degrading the performance of the device. The method of forming the dielectric layer 224 may include performing a CVD process such as a low pressure chemical vapor deposition (LPCVD) process or a plasma enhanced chemical vapor deposition (PECVD) process, and then planarizing the excess portion of the dielectric layer over the top electrode layer 218 by using a planarizing method, e.g., a CMP process, an etching process, a grinding process, a combination thereof, or the like. In some embodiments, the topmost surface of the top electrode layer 218 is substantially copla-nar or level with the topmost surface of the dielectric layer 224 within process variations of the planarization process.

In some embodiments, the memory stack MS1 of the disclosure is thus completed. The memory stack MS1 may have a PCRAM structure. In some embodiments, the bottom electrode layer 204, the phase-change layer 216a, the polymer layer 217, the top electrode layer 218, the voids V, the moisture-resistant layer 222 and the dielectric layer 224 constitute the memory stack MS1.

In the memory stack MS1 of the disclosure, the voids V serve as heat shielding elements, and the polymer layer 217, the moisture-resistant layer 222 and the dielectric layer 224 serve as moisture blocking elements. By such disposition, the function of the phase-change layer 216a is stabilized, and the performance of the device is improved.

In some embodiments, a single photolithography mask or reticle is used to define the phase change layer 216a and the top electrode layer 218. The suitable etching processes may include an anisotropic etching process (see FIG. 5) and a lateral etching process (see FIG. 6). The size of the phase change layer between the bottom electrode layer and the top electrode layer is reduced without using a photolithography mask or reticle, which allows for process cost reduction. By reducing the width of the phase change layer, the heating of the phase change layer is centralized and therefore the reset current is reduced.

Figure 10:
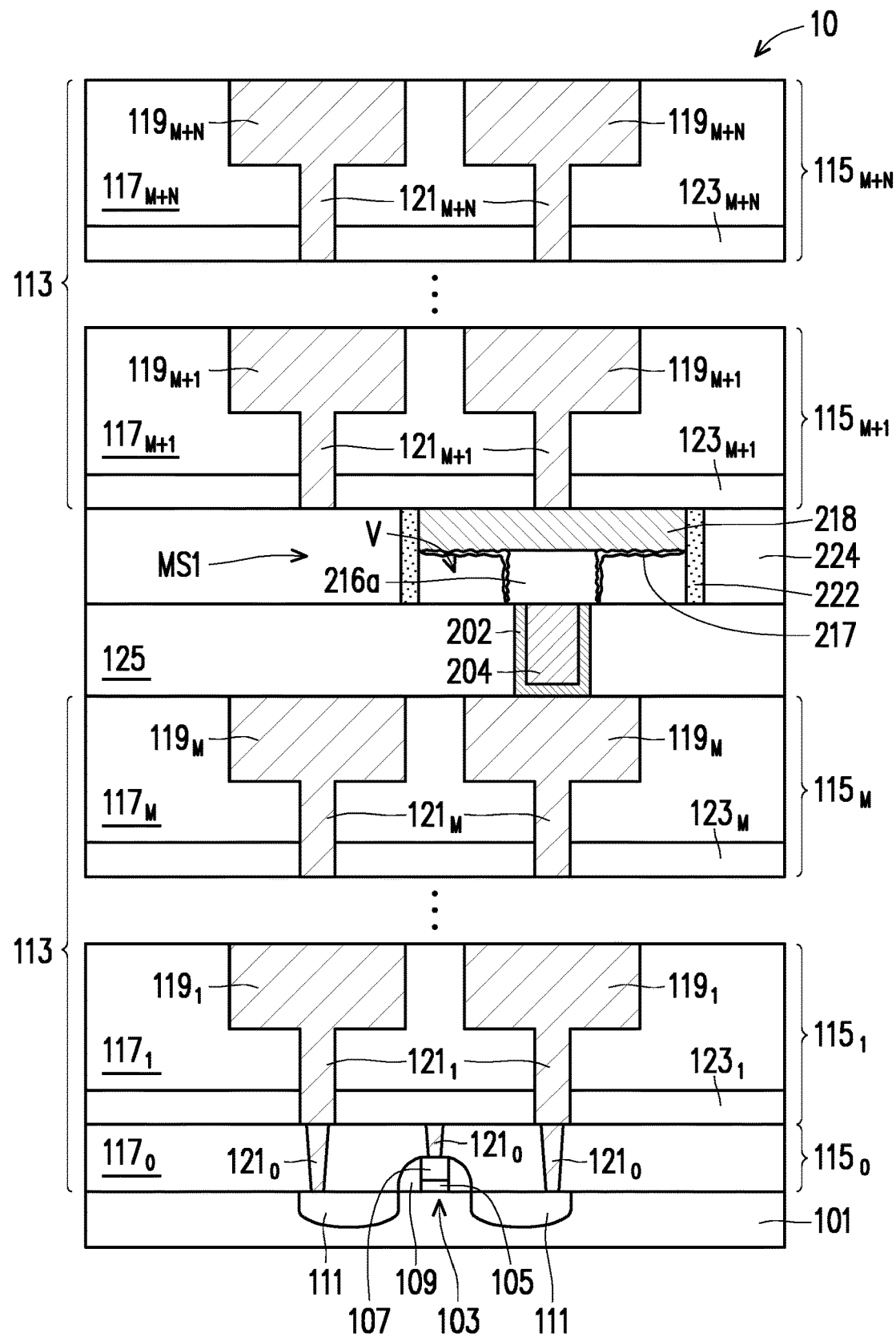

Referring to FIG. 10, additional metallization layers $115_{M+1}$ to $115_{M+N}$ are formed over the dielectric layer 224, with the metallization layer $115_{M+N}$ being the last metallization layer of the interconnect structure 113. In some embodiments, the conductive via $121_{M+1}$ is in physical contact with the top electrode layer 218 of the memory stack MS1. In some embodiments, the dielectric layers $117_{M+X}$ (with X=1, . . . , N) may be formed using similar materials and methods as the dielectric layers $117_0$ to $117_M$ described above with reference to FIG. 1, and the description is not repeated herein. In some embodiments, the ESLs $123_{M+X}$ (with X=1, . . . , N) may be formed using similar materials and methods as the ESLs $123_1$ to $123_M$ described above with reference to FIG. 1, and the description is not repeated herein. In some embodiments, the conductive lines $119_{M+X}$ (with X=1, . . . , N) may be formed using similar materials and methods as the conductive lines $119_1$ to $119_M$ described above with reference to FIG. 1, and the description is not repeated herein. In some embodiments, the conductive vias $121_{M+X}$ (with X=1, . . . , N) may be formed using similar materials and methods as the conductive vias $121_1$ to $121_M$ described above with reference to FIG. 1, and the description is not repeated herein. In some embodiments, N is equal to 1. In other embodiments, N is greater than 1. In some embodiments, a memory device 10 of the disclosure is thus completed, The above embodiments in which the memory stack MS1 is provided between the fourth conductive line and the fifth conductive line are provided for illustration purposes, and are not construed as limiting the present disclosure. In other embodiments, upon the process requirements, the memory stack MS1 may be provided between two adjacent conductive lines, such as between the first conductive line and the second conductive line, between the second conductive line and the third conductive line, between the third conductive line and the fourth conductive line or between the fifth conductive line and the sixth conductive line, etc.

Figure 11:
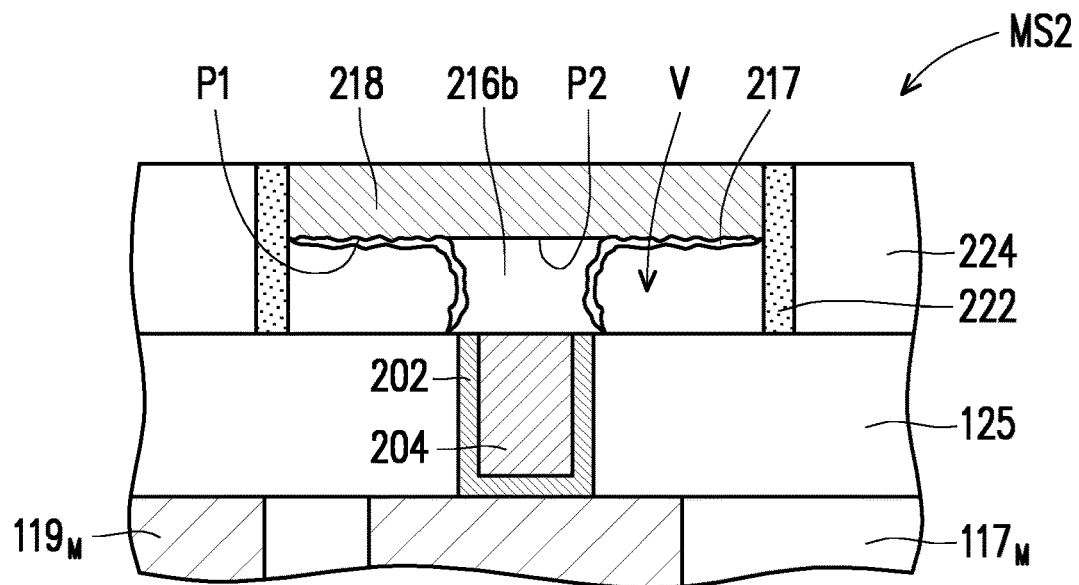
FIG. 11 to FIG. 12 are schematic cross-sectional views of various memory stacks in accordance with some embodiments.
Figure 12:
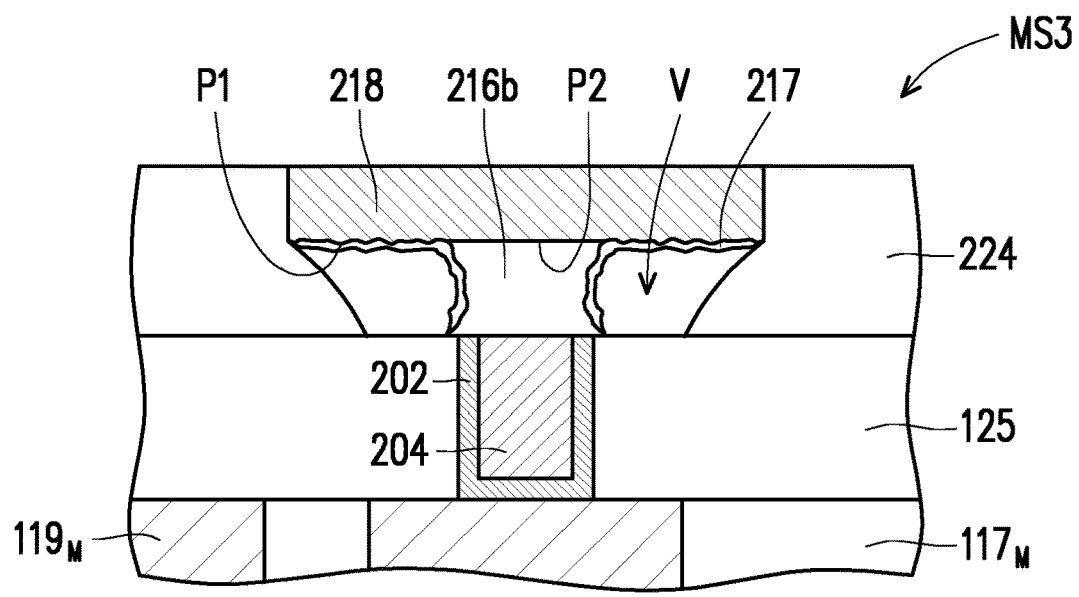

The memory stack MS1 in the memory device 10 may be modified to have other configurations, as shown in FIG. 11 to FIG. 12. Each of the memory stacks MS2 to MS3 of FIG. 11 to FIG. 12 may be similar to the memory stack MS1 of FIG. 10, with similar features of the memory stacks being labeled with similar numerical references and descriptions of the similar features are not repeated herein.

The memory stack MS2 of FIG. 11 may be similar to the memory stack MS1 of FIG. 10, and the difference between them lies in the shape of the phase change layer. In some embodiments, the phase change layer 216a of the memory stack MS1 has a substantially vertical sidewall, while the phase change layer 216b of the memory stack MS2 has a curved sidewall that is concave with respect to the interior of the phase change layer 216b. In the illustrated embodiment, the phase change layer 216b of the memory stack MS2 has a narrow-middle profile that is narrow in a middle portion thereof. Specifically, the middle portion is narrower than the top portion or the bottom portion. For example, the middle portion of the phase change layer 216b is the narrowest portion of the narrow-middle profile. Besides, the top portion and the bottom portion may have the same or different widths. In some embodiments, the phase change layer 216b may be described as having a vase-shaped profile, an hourglass-shaped profile, a Coca-Cola glass shaped profile or the like. In some embodiments, the memory stack MS2 may be formed using process steps described above with reference to FIG. 1 to FIG. 10, but adjusting the parameters of the lateral etching process in FIG. 6.

The memory stack MS3 of FIG. 12 may be similar to the memory stack MS2 of FIG. 11, and the difference between them lies in that, the moisture-resistant layer 222 is provided for the memory stack MS1 while omitted from the memory stack MS3. In some embodiments, the memory stack MS3 may be formed using process steps described above with reference to FIG. 1 to FIG. 10, but omitting the formation of the moisture-resistant layer 222. In the illustrated embodiment, the dielectric layer 224 is in physical contact with the sidewall of the top electrode layer 218. Specifically, the dielectric layer 224 is formed along the sidewall of the top electrode layer 218 and extends downwardly to the dielectric layer 125, and two voids V are present between the dielectric layer 224 and the phase change layer 216b and between the top electrode layer 218 and the dielectric layer 125. In some embodiments, a portion of the dielectric layer 224 of the memory stack MS3 further extends below the top electrode layer 218, so the voids V are provided with a smaller size. Specifically, the dielectric layer 224 has a curved sidewall that is slightly inclined from the bottom edge of the top electrode layer 218 toward the phase change layer 216b. In the illustrated embodiment, the voids V of some embodiments have a top width greater than a bottom width.

FIG. 13 to FIG. 21 illustrate cross-sectional views of intermediate stages in the manufacturing of a memory device in accordance with other embodiments.

Figure 13:
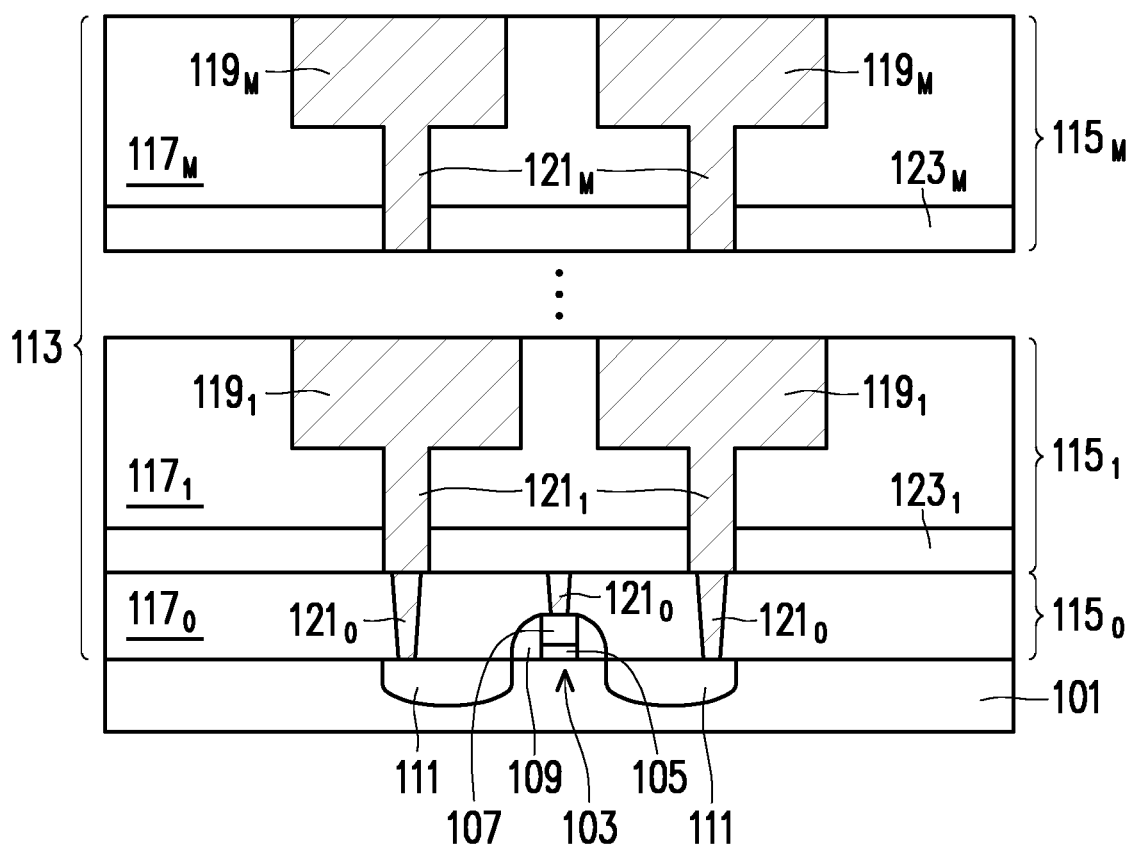
FIG. 13 to FIG. 20 illustrate cross-sectional views of intermediate stages in the manufacturing of a memory device in accordance with other embodiments.

In some embodiments, the structure illustrated in FIG. 13 is similar to the structure illustrated in FIG. 1, with similar features being labeled with similar numerical references and descriptions of the similar features are not repeated herein.

Figure 14:
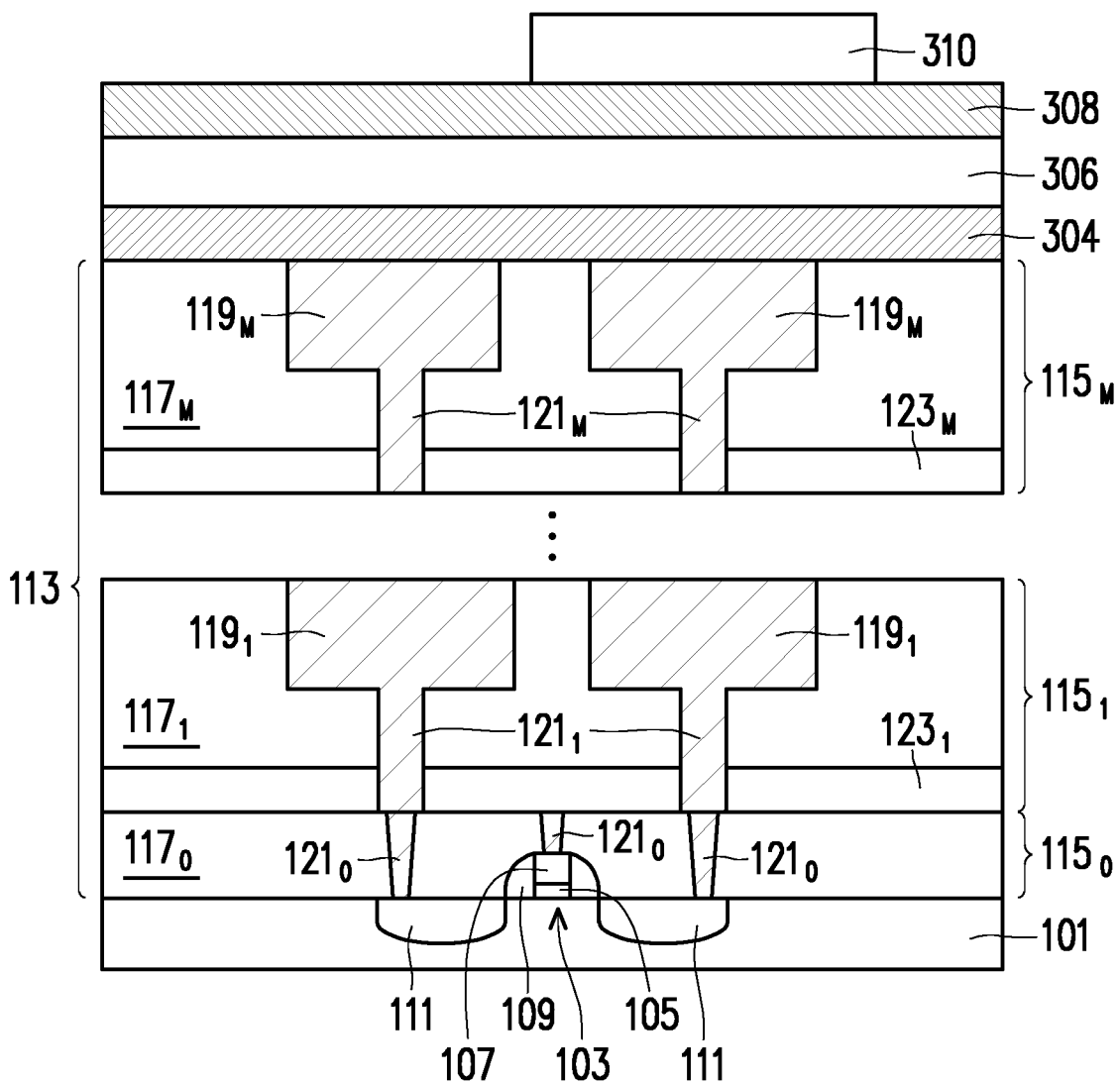

Referring to FIG. 14, a bottom electrode material layer 304 is blanket deposited over the dielectric layer $117_M$. In some embodiments, the bottom electrode layer 304 includes a conductive material such as Ti, Co, W, Ru, Cu, AlCu, WN, TiN, TiW, TiAl, TiAlN, a combination thereof, a multilayer thereof, or like, and may be formed using CVD, ALD, PVD, a combination thereof, or the like.

Thereafter, a phase change material layer 306 is blanket deposited over the bottom electrode material layer 304, and a top electrode material layer 308 is blanket deposited over the phase change material layer 306. In some embodiments, the phase change material layer 306 and the top electrode material layer 308 may be formed using the similar materials and methods as the phase change material layer 206 and the top electrode material layer 308, and the description is not repeated herein.

Thereafter, a mask layer 310 is formed over the top electrode material layer 308. In some embodiments, the mask layer 310 may be formed using the similar material and method as the mask layer 210, and the description is not repeated herein.

Figure 15:
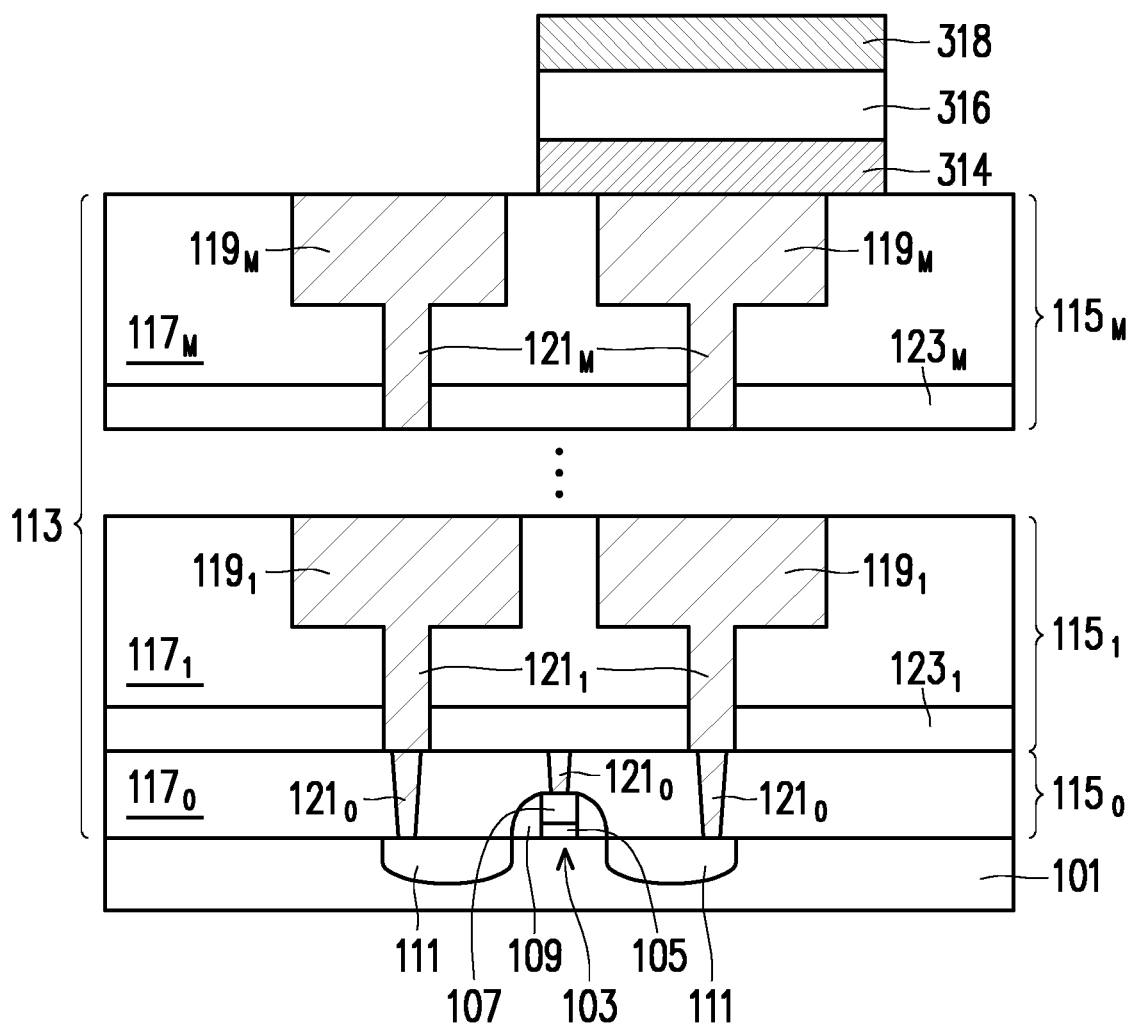

Referring to FIG. 15, the bottom electrode material layer 304, the phase change material layer 306 and the top electrode material layer 308 are patterned by using the mask layer 310 as a mask, so as to form a bottom electrode material layer 314, a phase change layer 316 and a top electrode layer 318 sequentially disposed on the dielectric layer $117_M$. In some embodiments, the patterning process includes an anisotropic etching process, such as a dry etching process.

In some embodiments, the dry etching process includes an etching gas, a passivation gas and a heat transfer gas. In some embodiments, the etching gas includes HBr, $O_2$, $Cl_2$, $SF_6$ or a combination thereof, and has a flow rate of about 20 to 500 cubic centimeters per minute (sccm). In some embodiments, the passivation gas includes $CH_4$, $CH_3F$, $CH_2F_2$, $CHF_3$ or a combination thereof, and has a flow rate of about 10 to 100 sccm. In some embodiments, the heat transfer gas includes Ar, He or a combination thereof, and has a flow rate of about 100 to 1,000 sccm. In some embodiments, the bias voltage is turned on and set at a range from about 100 to 1,000 V during the dry etching process. In some embodiments, the dry etching process has an etching rate ratio or etching selectivity (e.g., greater than 20:1) of the phase change layer 316 with respect to the underlying dielectric layer $117_M$.

After the bottom electrode material layer 304, the phase change material layer 306 and the top electrode material layer 308 are patterned to form the bottom electrode material layer 314, the phase change layer 316 and the top electrode layer 318, the mask layer 310 is then removed. In some embodiments, each of the bottom electrode material layer 314, the phase change layer 316 and the top electrode layer 318 has a width of about 100 to 300 nm.

Figure 16:
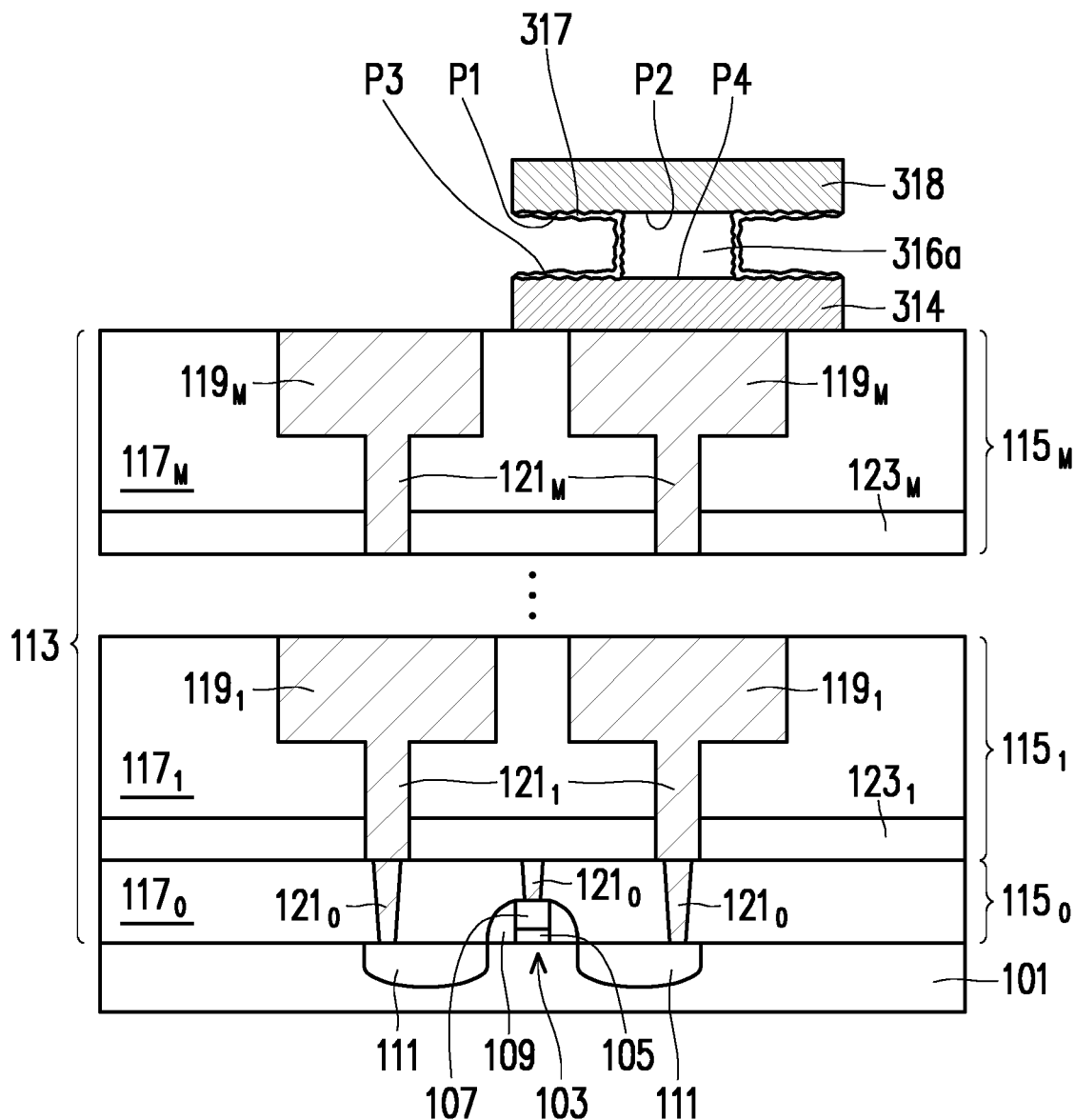

Referring to FIG. 16, a lateral etching process is performed to the phase change layer 316, so as to reduce the dimension of the phase change layer 316. In some embodiments, the lateral etching process has an etching rate ratio or etching selectivity (e.g., greater than 100:1) of the phase change layer 316 with respect to the underlying dielectric layer $117^M$, and has an etching rate ratio or etching selectivity (greater than 30:1) of the phase change layer 316 with respect to the adjacent top electrode layer 318 or the bottom electrode layer 314. In some embodiments, the lateral etching process reduces the dimension of the phase change layer 316 while keeps the dimension of the adjacent top electrode layer 318 and the bottom electrode layer 314 substantially unchanged. Upon the lateral etching process, the phase change layer 316 is trimmed to a phase change layer 316a with a reduced dimension. The lateral etching process is referred to as a trimming process in some example. In some embodiments, the phase change layer 316a has a width of about 20 to 100 nm.

In some embodiments, the width (e.g., bottom width) of the phase change layer 316a is less than the width (e.g., top width) of the bottom electrode layer 314. In some embodiments, the width (e.g., top width) of the phase change layer 316a is less than the width (e.g., bottom width) of the top electrode layer 318. For example, the width of the bottom electrode layer 314 or the top electrode layer 318 is about 3-5 times the width of the phase change layer 316a.

In some embodiments, the lateral etching process includes an etching gas, a passivation gas and a heat transfer gas. In some embodiments, the etching gas includes HBr, $O_2$, $Cl_2$, $SF_6$ or a combination thereof, and has a flow rate of about 20 to 500 sccm. In some embodiments, the passivation gas includes $CH_4$, $CH_3F$, $CH_2F_2$, $CHF_3$ or a combination thereof, and has a flow rate of about 10 to 100 sccm. In some embodiments, the heat transfer gas includes Ar, He or a combination thereof, and has a flow rate of about 100 to 1,000 sccm. In some embodiments, the bias voltage is turned off during the lateral etching process.

In some embodiments, upon the lateral etching process, the first portion P1 of the top electrode layer 318 uncovered by the phase change layer 316a is rougher than the second portion P2 of the top electrode layer 318 covered by the phase change layer 316a. In some embodiments, upon the lateral etching process, the first portion P1 of the top electrode layer 318 uncovered by the phase change layer 316a has a roughness Rz of about 0.5 nm to 1.5 nm, such as about 1.0 nm, while the second portion P2 of the top electrode layer 318 covered by the phase change layer 316a has a roughness Rz of less than about 1.0 nm, such as about 0.5 nm.

In some embodiments, upon the lateral etching process, the first portion P3 of the bottom electrode layer 314 uncovered by the phase change layer 316a is rougher than the second portion P4 of the bottom electrode layer 314 covered by the phase change layer 316a. In some embodiments, upon the lateral etching process, the first portion P3 of the bottom electrode layer 314 uncovered by the phase change layer 316a has a roughness Rz of about 0.5 nm to 1.5 nm, such as about 1.0 nm, while the second portion P4 of the bottom electrode layer 314 covered by the phase change layer 316a has a roughness Rz of less than about 1.0 nm, such as about 0.5 nm.

In some embodiments, the sidewall of the phase change layer 316a has a roughness Rz of about 0.5 nm to 1.5 nm, such as about 1.0 nm. In some embodiments, the surface roughness Rz is calculated by measuring the vertical distance from the highest peak to the lowest valley within a predetermined sampling length or area.

In some embodiments, upon the lateral etching process, a polymer layer 317 is accumulated on the sidewall of the phase change layer 316a, the bottom surface of the top electrode layer 318 and the top surface of the bottom electrode layer 314. The polymer layer 317 may operate to prevent the moisture from contacting the phase change layer 316a and degrading the performance of the device. In some embodiments, the polymer layer 317 has a thickness of about 5 to 20 angstroms.

In some embodiments, the polymer layer 317 includes one or more of carbon, hydrogen and oxygen atoms. In some embodiments, the polymer layer 317 includes a carbon atom content of about 30-90 at %, a hydrogen atom content of about 10-25 at %, and an oxygen atom content of less than about 5 at %.

Figure 17:
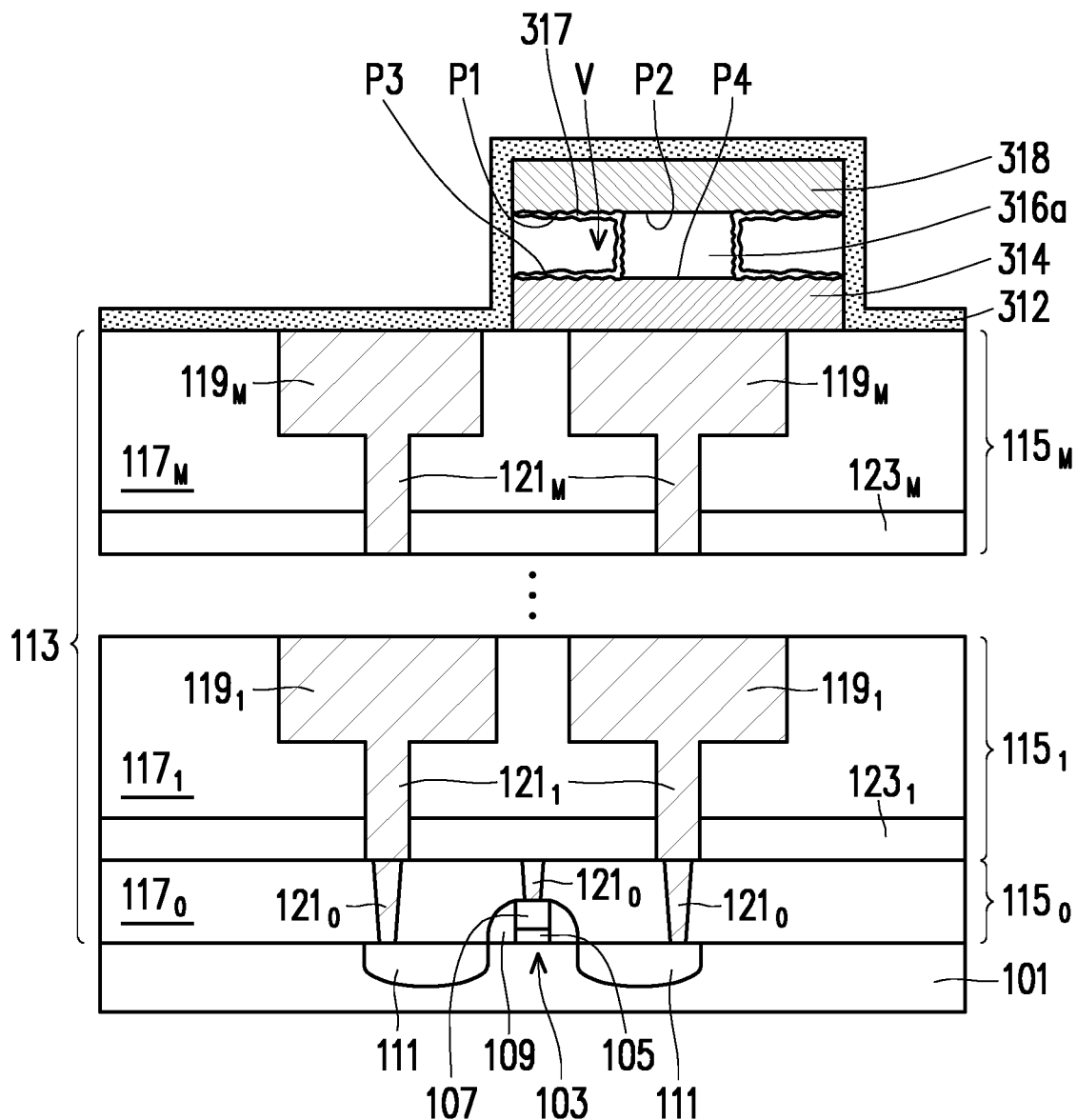

Referring to FIG. 17, a moisture-resistant material layer 312 is formed over the dielectric layer $117^M$ and covers the top electrode layer 318. The moisture-resistant material layer 312 functions as a protection layer that effectively blocks water or moisture from penetrating into the phase change layer 316a. In some embodiments, the moisture-resistant material layer 312 is formed on the top surface of the top electrode layer 318, extends along the sidewall of the top electrode layer 318, downwardly to the dielectric layer $117^M$ and along the sidewall of the bottom electrode layer 314, and continues to extend along the top surface of the dielectric layer $117_M$. Accordingly, at least one void V is formed between the moisture-resistant material layer 312 and the phase change layer 316a and between the top electrode layer 318 and the bottom electrode layer 314. In some embodiments, the moisture-resistant material layer 312 may include silicon nitride ($Si_3N_4$), silicon oxynitride, silicon carbide or the like, and may be formed using an ALD process at a process temperature of less than about 400° C., such as from about 200° C. to 250° C. This process temperature is beneficial to form the moisture-resistant material layer 312 with such configuration that is able to encapsulate voids therein.

Figure 18:
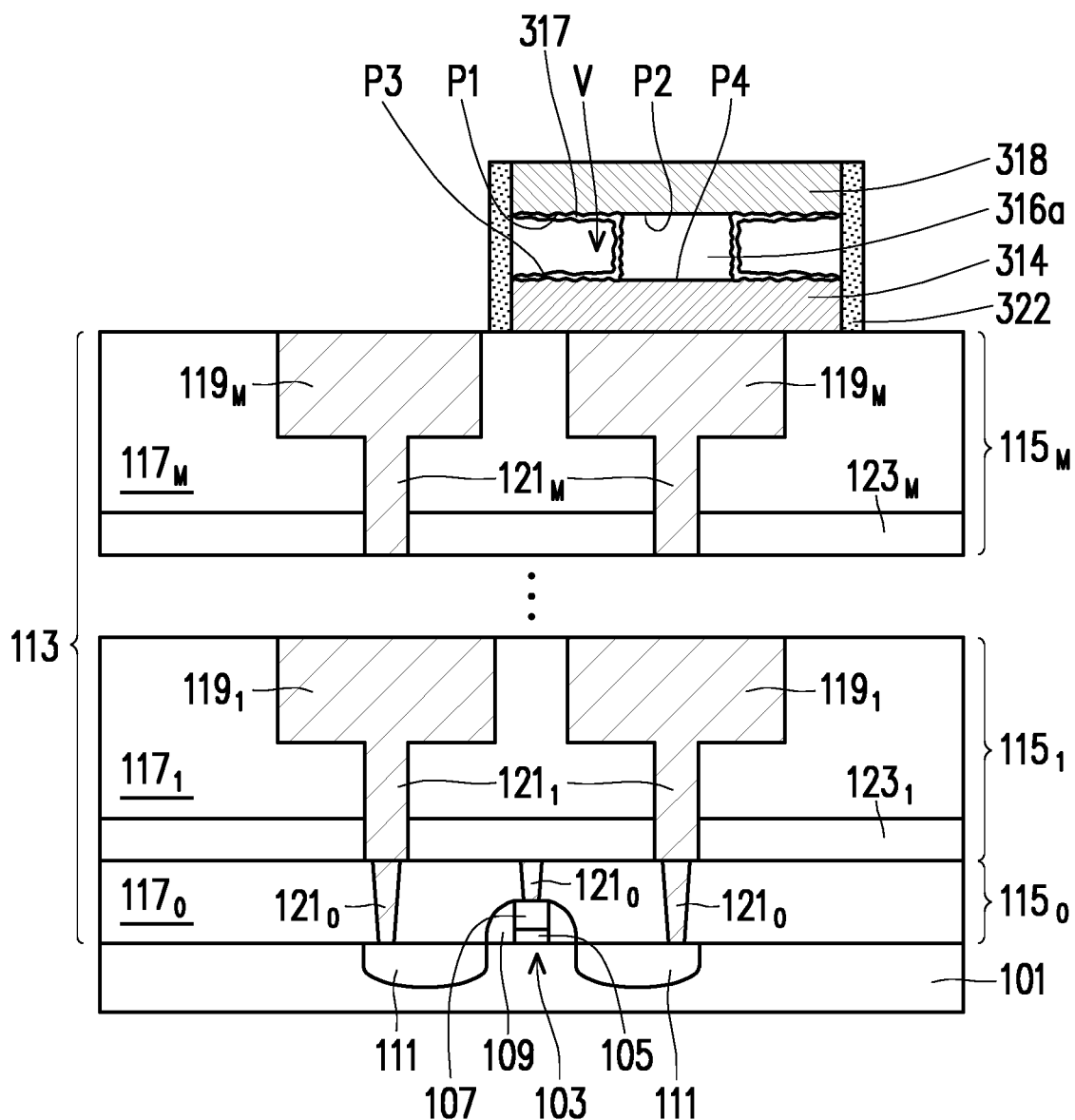

Referring to FIG. 18, an anisotropic etching process is performed to the moisture-resistant material layer 312, so as to remove a portion of the moisture-resistant material layer 312. Specifically, the lateral portion of the moisture-resistant material layer 312 is removed, while the vertical portion of moisture-resistant material layer 312 remains. In some embodiments, the remaining moisture-resistant material layer 312 forms a moisture-resistant layer 322 in a spacer form. In some embodiments, the moisture-resistant layer 322 is formed on the sidewall of the top electrode layer 318, extends downwardly to the dielectric layer 117M, and on the sidewall of the bottom electrode layer 314. Accordingly, two voids V are formed between the top electrode layer 318 and the bottom electrode layer 314 and at two sides of the phase change layer 316a. In some embodiments, the voids V are filled with a gas, such as air, a process gas or an inert gas. In other embodiments, the voids V are in a vacuum state. Each of the voids V (either filled with a gas or in a vacuum state) functions as a heat insulator that is beneficial to reduce the heat loss of the phase change layer 216a due to heat conduction or convection.

Figure 19:
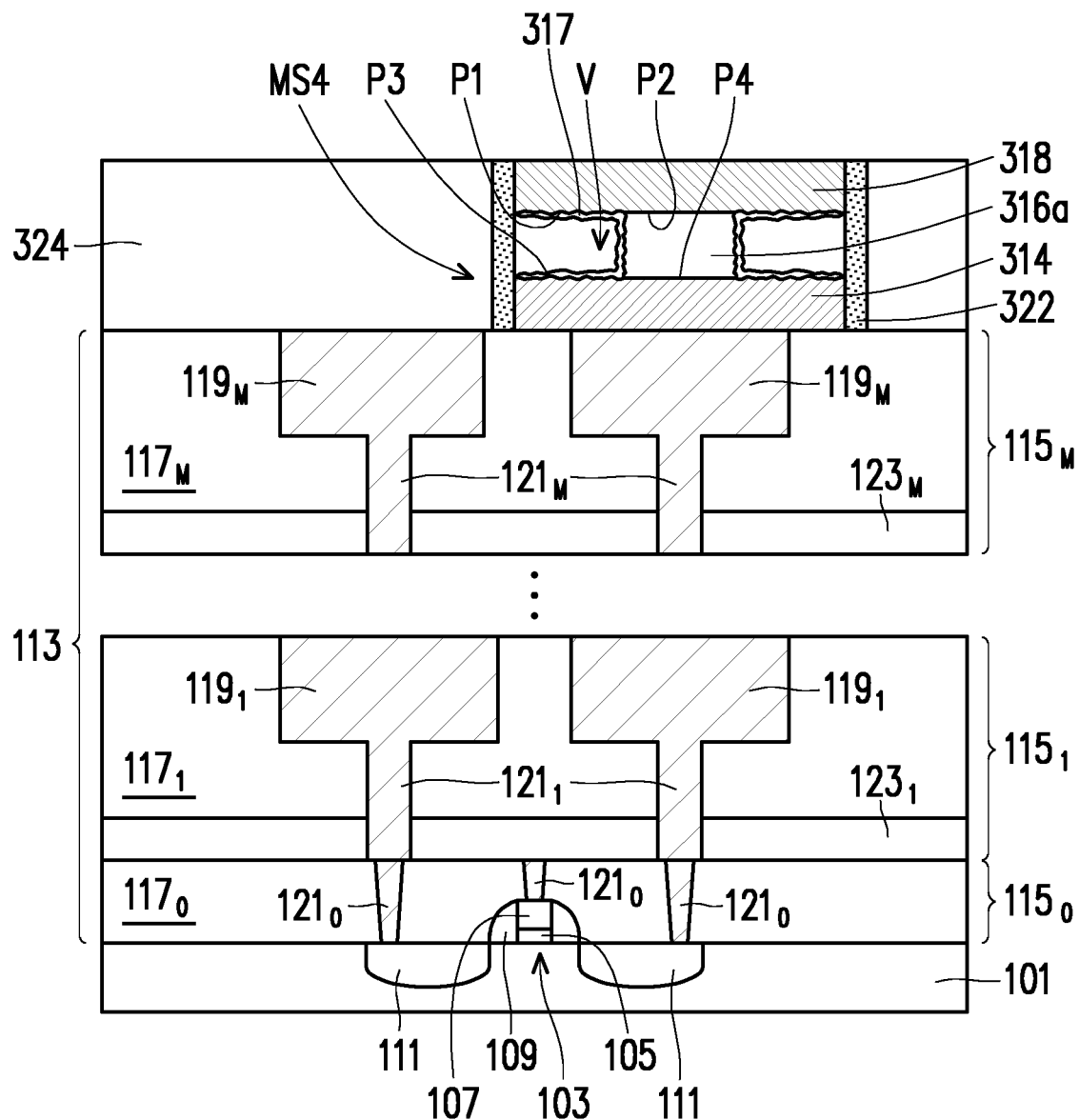

Referring to FIG. 19, a dielectric layer 324 is formed over the dielectric layer $117_M$ and aside the moisture-resistant layer 322. In some embodiments, the dielectric layer 324 may be formed using the similar material and method as the dielectric layer 224, and the description is not repeated herein.

In some embodiments, the memory stack MS4 of the disclosure is thus completed. The memory stack MS4 may have a PCRAM structure. In some embodiments, the bottom electrode layer 314, the phase-change layer 316a, the polymer layer 317, the top electrode layer 318, the voids V, the moisture-resistant layer 322 and the dielectric layer 324 constitute the memory stack MS4.

In the memory stack MS4 of the disclosure, the voids V serve as heat shielding elements, and the polymer layer 317, the moisture-resistant layer 322 and the dielectric layer 324 serve as moisture blocking elements. By such disposition, the function of the phase-change layer 216a is stabilized, and the performance of the device is improved.

In some embodiments, a single photolithography mask or reticle is used to define the bottom electrode layer 314, the phase change layer 316a and the top electrode layer 318. The suitable etching processes may include an anisotropic etching process (see FIG. 15) and a lateral etching process (see FIG. 16). The size of the phase change layer between the bottom electrode layer and the top electrode layer is reduced without using a photolithography mask or reticle, which allows for process cost reduction. By reducing the width of the phase change layer, the heating of the phase change layer is centralized and therefore the reset current is reduced.

Figure 20:
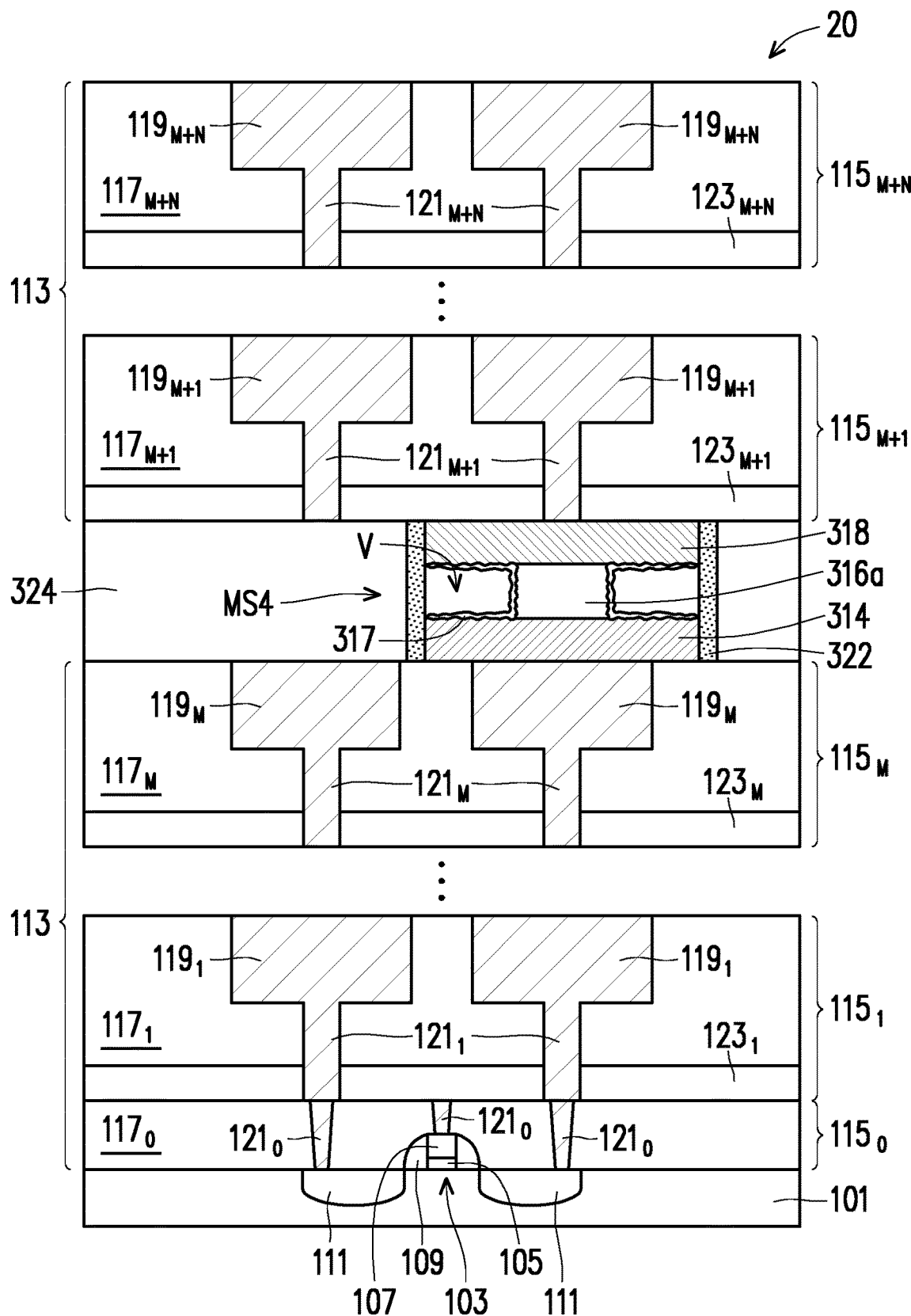

Referring to FIG. 20, additional metallization layers $115_{M+1}$ to $115_{M+N}$ are formed over the dielectric layer 324, with the metallization layer $115_{M+N}$ being the last metallization layer of the interconnect structure 113. In some embodiments, the conductive via $121_{M+1}$ is in physical contact with the top electrode layer 318 of the memory stack MS4. In some embodiments, the metallization layers $115_{M+1}$ to $115_{M+N}$ are formed using process steps described above with reference to FIG. 10 and the description is not repeated herein. In some embodiments, a memory device 20 of the disclosure is thus completed.

The above embodiments in which the memory stack MS4 is provided between the fourth conductive line and the fifth conductive line are provided for illustration purposes, and are not construed as limiting the present disclosure. In other embodiments, upon the process requirements, the memory stack MS4 may be provided between two adjacent conductive lines, such as between the first conductive line and the second conductive line, between the second conductive line and the third conductive line, between the third conductive line and the fourth conductive line or between the fifth conductive line and the sixth conductive line, etc.

Figure 21:
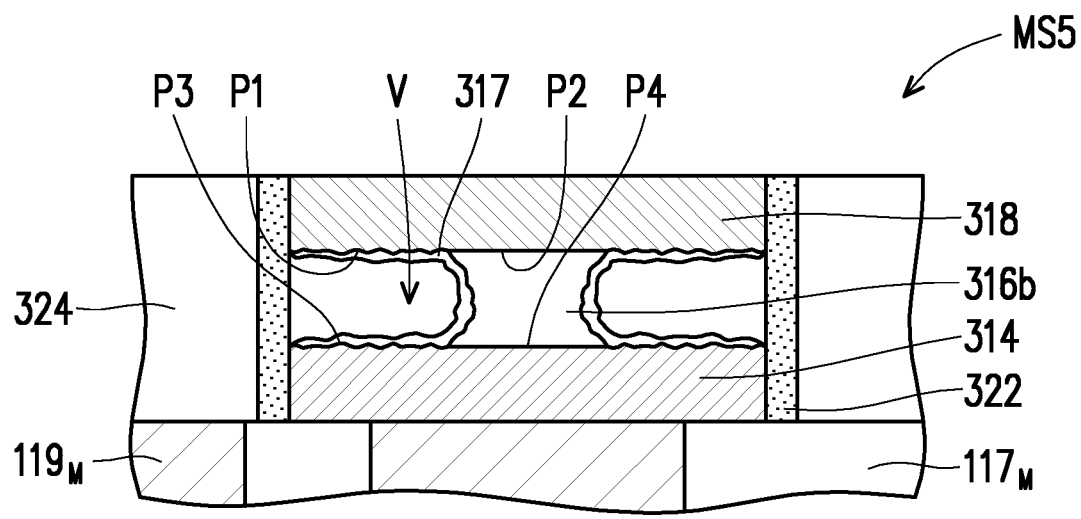
FIG. 21 to FIG. 22 are schematic cross-sectional views of various memory stacks in accordance with other embodiments.
Figure 22:
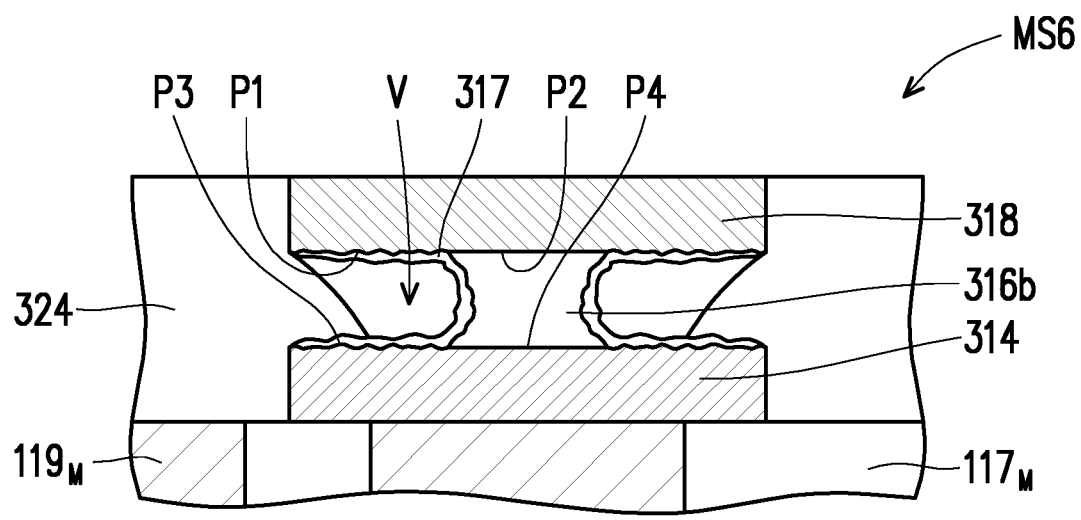

The memory stack MS4 in the memory device 20 may be modified to have other configurations, as shown in FIG. 21 to FIG. 22. Each of the memory stacks MS5 to MS6 of FIG. 21 to FIG. 22 may be similar to the memory stack MS4 of FIG. 20, with similar features of the memory stacks being labeled with similar numerical references and descriptions of the similar features are not repeated herein.

The memory stack MS5 of FIG. 21 may be similar to the memory stack MS4 of FIG. 20, and the difference between them lies in the shape of the phase change layer. In some embodiments, the phase change layer 316a of the memory stack MS4 has a substantially vertical sidewall, while the phase change layer 316b of the memory stack MS5 has a curved sidewall that is concave with respect to the interior of the phase change layer 316b. In the illustrated embodiment, the phase change layer 316b of the memory stack MS4 has a narrow-middle profile that is narrow in a middle portion thereof. Specifically, the middle portion is narrower than the top portion or the bottom portion. For example, the middle portion of the phase change layer 316b is the narrowest portion of the narrow-middle profile. Besides, the top portion and the bottom portion may have the same or different widths. In some embodiments, the phase change layer 316b may be described as having a vase-shaped profile, an hourglass-shaped profile, a Coca-Cola glass shaped profile or the like. In some embodiments, the memory stack MS5 may be formed using process steps described above with reference to FIG. 13 to FIG. 20, but adjusting the parameters of the lateral etching process in FIG. 16.

The memory stack MS6 of FIG. 22 may be similar to the memory stack MS4 of FIG. 21, and the difference between them lies in that, the moisture-resistant layer 322 is provided for the memory stack MS5 while omitted from the memory stack MS6. In some embodiments, the memory stack MS4 may be formed using process steps described above with reference to FIG. 13 to FIG. 20, but omitting the formation of the moisture-resistant layer 322. In the illustrated embodiment, the dielectric layer 324 is in physical contact with the sidewall of the top electrode layer 318 and the sidewall of the bottom electrode layer 314. Specifically, the dielectric layer 324 is formed along the sidewall of the top electrode layer 318 and extends downwardly to the dielectric layer $117_M$, and two voids V are present between the dielectric layer 324 and the phase change layer 316b and between the top electrode layer 318 and the bottom electrode layer 314. In some embodiments, a portion of the dielectric layer 324 of the memory stack MS6 further extends below the top electrode layer 318, so the voids V are provided with a smaller size. Specifically, the dielectric layer 324 has a slightly curved sidewall that is inclined from the bottom edge of the top electrode layer 318 toward the phase change layer 316b, and covers a portion of the bottom electrode layer 314. In the illustrated embodiment, the voids V of some embodiments have a top width greater than a bottom width.

The memory stack of the disclosure and its modifications will be described below with reference to the cross-sectional views of FIGS. 10-12 and FIGS. 20-22.

In accordance with some embodiments of the present disclosure, as shown in FIGS. 10-12 and FIGS. 20-22, a memory stack MS1/MS2/MS3/MS4/MS5/MS6 includes a bottom electrode layer 204/314, a top electrode layer 218/318 and a phase change layer 216a/216b/316a/316b between the bottom electrode layer 204/314 and the top electrode layer 204/314. The width of the top electrode layer 218/318 is greater than the width of the phase change layer 216a/216b/316a/316b. A first portion P1 of the top electrode layer 218/318 uncovered by the phase change layer 216a/216b/316a/316b is rougher than a second portion P2 of the top electrode layer 218/318 covered by the phase change layer 216a/216b/316a/316b.

In some embodiments, as shown in FIG. 10 and FIG. 20, the phase change layer 216a/316a has a vertical sidewall profile. In some embodiments, as shown in FIGS. 11-12 and FIGS. 21-22, the phase change layer 216b/316b has a narrow-middle profile that is narrow in a middle portion thereof.

In some embodiments, the memory stack MS1/MS2/MS3/MS4/MS5/MS6 further includes a polymer layer 217/317 disposed on a sidewall of the phase change layer 216a/216b/316a/316b.

In some embodiments, as shown in FIGS. 10-12, the width of the phase change layer 216a/216b is greater than the width of the bottom electrode layer 204. In some embodiments, as shown in FIGS. 20-22, the width of the phase change layer 316a/316b is less than the width of the bottom electrode layer 314.

In some embodiments, the first portion P1 of the top electrode layer 218/318 uncovered by the phase change layer 216a/216b/316a/316b has a roughness Rz of about 0.5 nm to 1.5 nm. In some embodiments, the sidewall of the phase change layer 216a/216b/316a/316b has a roughness Rz of about 0.5 nm to 1.5 nm.

In some embodiments, at least one void V is aside the phase change layer 216a/216b/316a/316b and between the bottom electrode layer 204/314 and the top electrode layer 218/318.

In some embodiments, as shown in FIGS. 10-11 and FIGS. 20-21, the memory stack MS1/MS2/MS4/MS5 includes a dielectric layer 224/324 aside the phase change layer 216a/216b/316a/316b, and a moisture-resistant layer 222/322 between the phase change layer 216a/216b/316a/316b and the dielectric layer 224/324.

In accordance with some embodiments of the present disclosure, as shown in FIGS. 10-12, a memory stack MS1/MS2/MS3 includes a bottom electrode layer 204, a dielectric layer 125 aside the bottom electrode layer 204, a phase change layer 216a/216b over the bottom electrode layer 204, a dielectric layer 224 aside the phase change layer 216a/216b, and a top electrode layer 218 over the phase change layer 216a/216b. At least one void V is between the phase change layer 216a/216b and the dielectric layer 224 and between the dielectric layer 125 and the top electrode layer 218. In some embodiments, a polymer layer 217 is disposed at least on the sidewall of the phase change layer 216a/216b. In some embodiments, a moisture-resistant layer 222 is disposed between the at least one void V and the dielectric layer 224 and in physical contact with the sidewall of the top electrode layer 218.

In accordance with some embodiments of the present disclosure, as shown in FIGS. 20-22, a memory stack MS4/MS5/MS6 includes a bottom electrode layer 314, a phase change layer 316a/316b over the bottom electrode layer 314, a top electrode layer 318 over the phase change layer 316a/316b, a dielectric layer 324 aside the phase change layer 316a/316b. At least one void V is between the phase change layer 316a/316b and the dielectric layer 324 and between the bottom electrode layer 314 and the top electrode layer 318. In some embodiments, a polymer layer 317 is disposed at least on the sidewall of the phase change layer 316a/316b. In some embodiments, a moisture-resistant layer 322 is disposed between the at least one void V and the dielectric layer 324 and in physical contact with the sidewalls of the top electrode layer 318 and the bottom electrode 314.

In accordance with some embodiments of the present disclosure, a memory stack includes a bottom electrode layer, a top electrode layer and a phase change layer between the bottom electrode layer and the top electrode layer. A width of the top electrode layer is greater than a width of the phase change layer. A first portion of the top electrode layer uncovered by the phase change layer is rougher than a second portion of the top electrode layer covered by the phase change layer.

In accordance with other embodiments of the present disclosure, a memory stack includes a bottom electrode layer, a first dielectric layer aside the bottom electrode layer, a phase change layer over the bottom electrode layer, a second dielectric layer aside the phase change layer, and a top electrode layer over the phase change layer. At least one void is between the phase change layer and the second dielectric layer and between the first dielectric layer and the top electrode layer.

In accordance with yet other embodiments of the present disclosure, a memory device includes the following operations. A bottom electrode layer is formed in the first dielectric layer. A phase change material layer, a top electrode layer material layer and a mask layer are sequentially formed over the bottom electrode layer and the first dielectric layer. The phase change material layer and the top electrode layer material layer are patterned by using the mask layer as a mask, so as to form a phase change layer and a top electrode layer. A lateral etching process is performed to the phase change layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a memory stack, comprising:
   forming a bottom electrode layer in the first dielectric layer;
   sequentially forming a phase change material layer, a top electrode layer material layer and a mask layer over the bottom electrode layer and the first dielectric layer;
   patterning the top electrode layer material layer and the phase change material layer by using the mask layer as a mask, so as to form a phase change layer and a top electrode layer; and
   performing a lateral etching process to the phase change layer, such that a width of the top electrode layer is greater than a width of the phase change layer, and a first portion of the top electrode layer uncovered by the phase change layer is rougher than a second portion of the top electrode layer covered by the phase change layer.

2. The method of claim 1, further comprising forming a moisture-resistant layer along a sidewall of the top electrode layer and downwardly to a surface of the first dielectric layer, and at least one void is formed between the moisture-resistant layer and the phase change layer.

3. The method of claim 2, wherein a method of forming the moisture-resistant layer comprises performing an atomic layer deposition process at a temperature of less than about 400° C.

4. The method of claim 1, wherein a polymer layer is accumulated upon the lateral etching process.

5. The method of claim 1, wherein upon the lateral etching process, the phase change layer has a narrow-middle profile that is narrow in a middle portion thereof.

6. The method of claim 1, wherein the lateral etching process comprises an etching gas, a passivation gas and a heat transfer gas.

7. The method of claim 6, wherein the etching gas comprises $HBr$, $O_2$, $Cl_2$, $SF_6$ or a combination thereof, and has a flow rate of about 20 to 500 sccm.

8. The method of claim 6, wherein the passivation gas includes $CH_4$, $CH_3F$, $CH_2F_2$, $CHF_3$ or a combination t embodiments hereof, and has a flow rate of about 10 to 100 sccm.

9. The method of claim 6, wherein the heat transfer gas includes Ar, He or a combination thereof, and has a flow rate of about 100 to 1,000 sccm.

10. The method of claim 1, wherein a bias voltage is turned off during the lateral etching process.

11. A method of forming a memory stack, comprising:
    forming a memory stack comprising a bottom electrode layer, a top electrode layer, and a phase change layer between the bottom electrode layer and the top electrode layer; and
    trimming the phase change layer and simultaneously forming a polymer layer laterally along a bottom surface of the top electrode layer and extending downwardly along a sidewall of the phase change layer.

12. The method of claim 11, wherein the polymer layer further extends laterally along a top surface of the bottom electrode layer.

13. The method of claim 11, further comprising forming a dielectric layer around the memory stack, and at least one void is formed below the top electrode layer and between the phase change layer and the dielectric layer.

14. The method of claim 13, further comprising forming a moisture-resistant layer before forming the dielectric layer.

15. The method of claim 11, wherein a width of the phase change layer is greater than a width of the bottom electrode layer.

16. The method of claim 11, wherein a width of the phase change layer is less than a width of the bottom electrode layer.

17. A method of forming a memory stack, comprising:
- forming a bottom electrode layer in the first dielectric layer;
- sequentially forming a phase change layer and a top electrode layer on the bottom electrode layer, wherein a sidewall of the phase change layer is recessed from a sidewall of the top electrode layer; and
- forming a moisture-resistant layer, wherein the moisture-resistant layer extends along the sidewall of the top electrode layer and downwardly to a top surface of the first dielectric layer, without contacting the sidewall of the phase change layer.

18. The method of claim 17, wherein the moisture-resistant layer is separated from the bottom electrode layer.

19. The method of claim 17, further comprising forming a second dielectric layer around the moisture-resistant layer.

20. The method of claim 17, wherein at least one void is formed between the phase change layer and the moisture-resistant layer.

\* \* \* \* \*